(12) United States Patent
Muto

(10) Patent No.: US 12,105,663 B2
(45) Date of Patent: Oct. 1, 2024

(54) CIRCUIT DEVICE, ELECTRONIC APPARATUS, AND VEHICLE

(71) Applicant: SEIKO EPSON CORPORATION, Tokyo (JP)

(72) Inventor: Kota Muto, Matsumoto (JP)

(73) Assignee: SEIKO EPSON CORPORATION, Tokyo (JP)

(*) Notice: Subject to any disclaimer, the term of this patent is extended or adjusted under 35 U.S.C. 154(b) by 0 days.

(21) Appl. No.: 17/380,645

(22) Filed: Jul. 20, 2021

(65) Prior Publication Data
US 2022/0027304 A1  Jan. 27, 2022

(30) Foreign Application Priority Data
Jul. 22, 2020 (JP) .................................. 2020-125261

(51) Int. Cl.
*G06F 13/42* (2006.01)
*H03K 5/02* (2006.01)

(52) U.S. Cl.
CPC ........... *G06F 13/4282* (2013.01); *H03K 5/02* (2013.01); *G06F 2213/0042* (2013.01)

(58) Field of Classification Search
CPC ........ G06F 13/4282; G06F 2213/0042; H03K 5/02
See application file for complete search history.

(56) References Cited

U.S. PATENT DOCUMENTS

| | | | | |
|---|---|---|---|---|
| 10,326,437 B2* | 6/2019 | Muto | ...................... | H04B 3/54 |
| 10,509,756 B2* | 12/2019 | Yamada | .................. | G06F 13/20 |
| 2011/0148470 A1 | 6/2011 | Inoue | | |
| 2018/0212796 A1* | 7/2018 | Kamihara | ................ | G06F 1/06 |

FOREIGN PATENT DOCUMENTS

| | | | |
|---|---|---|---|
| CN | 102348271 A | * | 2/2012 |
| JP | H08172551 A | * | 7/1996 |
| JP | 2010-287035 | | 12/2010 |
| JP | 2010287035 A | * | 12/2010 |
| JP | 2011-129042 | | 6/2011 |

* cited by examiner

*Primary Examiner* — Metasebia T Retebo
*Assistant Examiner* — James G Yeaman
(74) *Attorney, Agent, or Firm* — Rankin, Hill & Clark LLP

(57) ABSTRACT

The circuit device includes an HS driver as a transmission circuit in an HS mode of USB, an amplitude detection circuit configured to detect a signal amplitude of a USB signal, an amplitude setting circuit configured to set an amplitude setting value of the signal amplitude of the USB signal, and a judgment circuit. The amplitude setting circuit varies the signal amplitude with the amplitude setting value in a detection period, and the judgment circuit determines the amplitude setting value to be used by the amplitude setting circuit when performing HS communication based on a detection result by the amplitude detection circuit in the detection period.

12 Claims, 15 Drawing Sheets

CIRCUIT DEVICE, ELECTRONIC APPARATUS, AND VEHICLE

The present application is based on, and claims priority from JP Application Serial Number 2020-125261, filed Jul. 22, 2020, the disclosure of which is hereby incorporated by reference herein in its entirety.

BACKGROUND

1. Technical Field

The present disclosure relates to a circuit device, an electronic apparatus, a vehicle, and so on.

2. Related Art

In the USB connection of recent years, there is a demand of setting an opening part of the eye pattern as wide as possible at a measurement point of the tip of a cable in order to make it possible for a device of USB connected to the tip of a cable to surely receive a signal. Since the amplitude of a USB signal is attenuated by the cable, in order to ensure a large amplitude at the tip of the cable to widen the opening part of the eye pattern, it is necessary to transmit the signal with a larger signal amplitude at a transmission end before the cable. Therefore, it is possible to adopt a method of transmitting the USB signal in the HS mode with a transmission current value in the HS mode set to a value higher than 17.78 mA as a nominal value in the USB specification. For example, in JP-A-2010-287035 (Document 1), the USB device as a reception side apparatus measures the amplitude value of the USB signal. Further, a host of the USB as a transmission side apparatus sets the transmission current value of an HS driver of the host based on the measurement result of the amplitude value in the device.

However, it has been found out that when increasing the transmission current value of the HS driver, the amplitude of the USB signal at a transmission node becomes excessively large to cause a problem. For example, when the amplitude at the transmission node increases to exceed a disconnection detection threshold value of the device, a false detection of the disconnection occurs during the connection of the device. For example, in the method of Document 1, the transmission current value is set based on the measurement result of the amplitude of the USB signal at the reception node in order to widen the opening part of the eye pattern at the reception node. In the method of Document 1, the problem of the false detection of the device disconnection caused by the increase in the amplitude at the transmission node is not at all considered.

SUMMARY

An aspect of the present disclosure relates to a circuit device including an HS driver as a transmission circuit in an HS mode of USB, an amplitude detection circuit configured to detect a signal amplitude of a USB signal, an amplitude setting circuit configured to set an amplitude setting value of the signal amplitude of the USB signal, and a judgment circuit, wherein the amplitude setting circuit varies the signal amplitude with the amplitude setting value in a detection period, and the judgment circuit determines the amplitude setting value to be used by the amplitude setting circuit when performing HS communication based on a detection result by the amplitude detection circuit in the detection period.

Further, another aspect of the present disclosure relates to an electronic apparatus including any one of the circuit devices described above.

Further, another aspect of the present disclosure relates to a vehicle including any one of the circuit devices described above.

DESCRIPTION OF AN EXEMPLARY EMBODIMENT

The present embodiment will hereinafter be described. It should be noted that the present embodiment described below do not unreasonably limit the contents set forth in the appended claims. Further, all of the constituents described in the present embodiment are not necessarily essential elements.

1. Circuit Device

Figure 1:
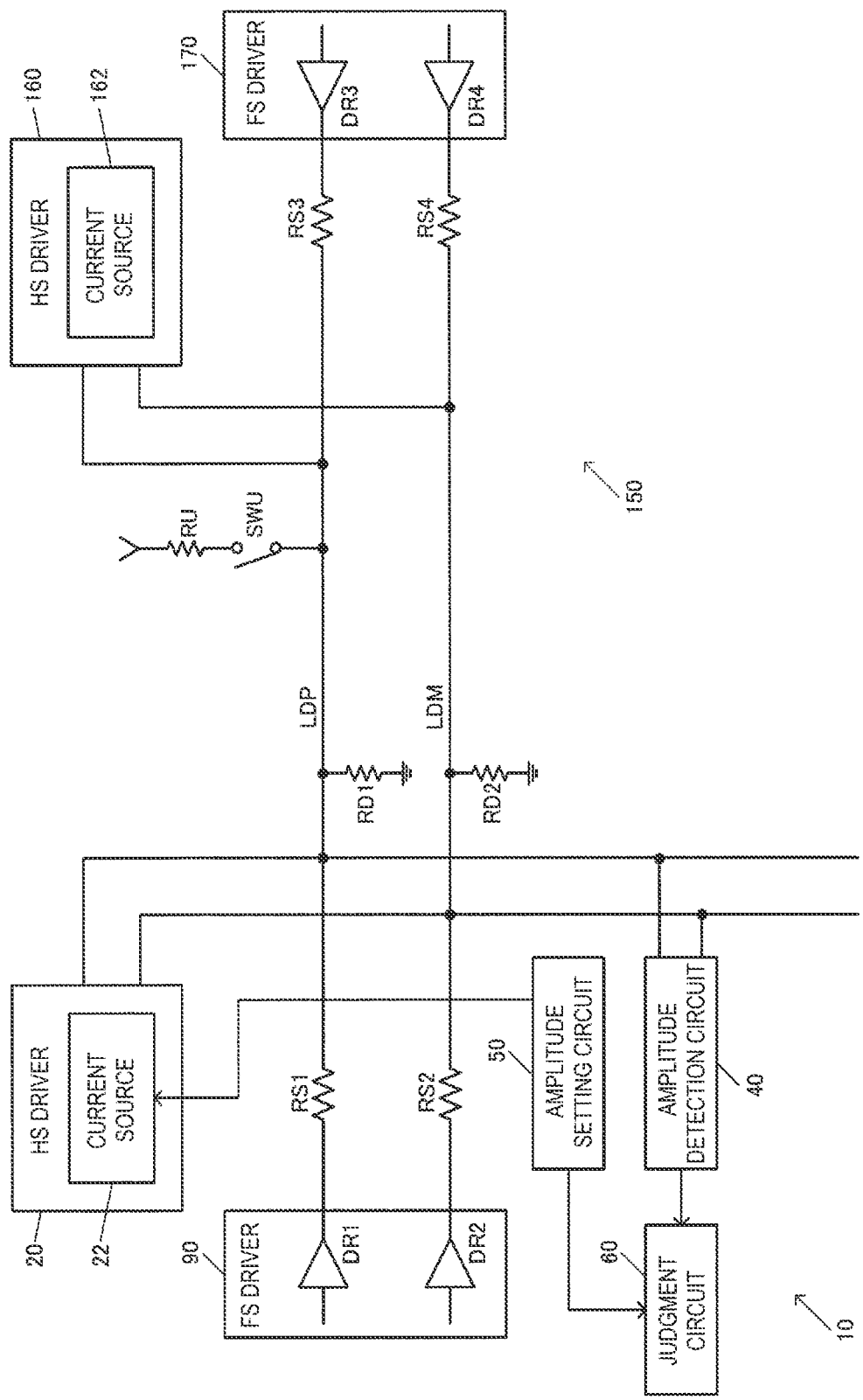
FIG. 1 is a diagram showing a configuration example of a circuit device according to an embodiment.
Figure 2:
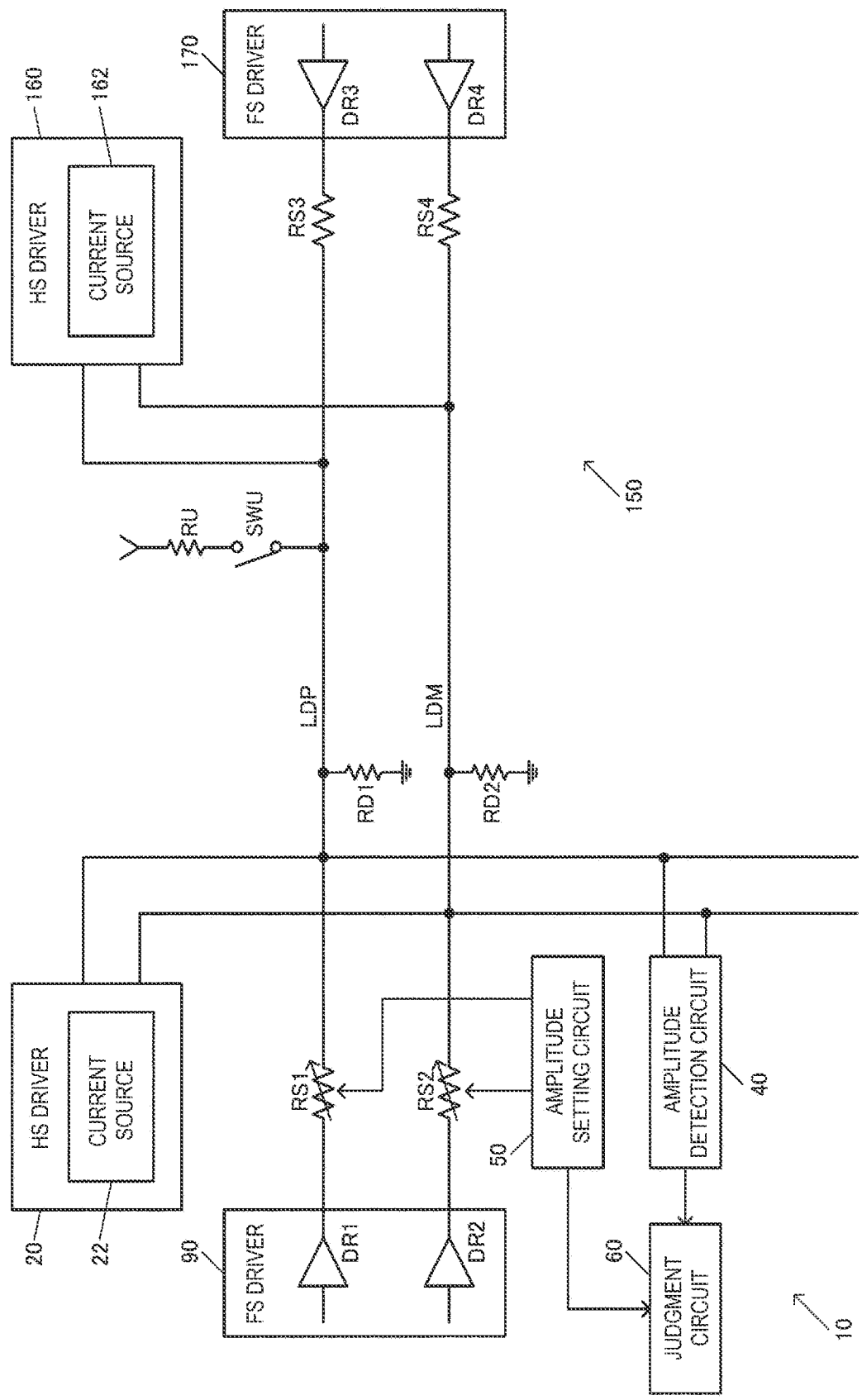
FIG. 2 is a diagram showing a configuration example of a circuit device according to the embodiment.

FIG. 1 and FIG. 2 each show a configuration example of a circuit device 10 according to the present embodiment. In FIG. 1 and FIG. 2, the circuit device 10 is a circuit device disposed at the host side of the USB. Meanwhile, a circuit device 150 is a circuit device disposed at the device side of the USB. The circuit devices 10, 150 are each an integrated circuit device (IC) realized by, for example, a semiconductor circuit.

As shown in FIG. 1 and FIG. 2, the circuit device 10 according to the present embodiment includes an HS driver 20, an amplitude detection circuit 40, an amplitude setting circuit 50, and a judgment circuit 60. Further, the circuit device 10 can include an FS driver 90, termination resistors RS1, RS2, and pull-down resistors RD1, RD2.

The HS driver 20 is a transmission circuit in the HS (High Speed) mode of the USB, and is a current driver for outputting drive current to signal lines LDP, LDM for a DP signal and a DM signal. The DP signal and the DM signal are differential output signals of the USB, and are signals forming a differential pair. The HS driver 20 includes a current source 22. The current source 22 is realized by, for example, a constant current circuit. Further, the HS driver 20 can include a switch for selecting which one of the signal lines LDP, LDM the drive current as a transmission current from the current source 22 is output to, and so on.

The FS driver 90 is a transmission circuit in the FS (Full Speed) mode of the USB, and is a voltage driver for voltage-driving the signal lines LDP, LDM. The FS driver 90 includes a driver circuit DR1 for driving the signal line LDP and a driver circuit DR2 for driving the signal line LDM. It should be noted that the FS driver 90 is also used for the LS (Low Speed) mode, and is a driver for both of the FS mode and the LS mode.

The termination resistors RS1, RS2 are disposed between the signal lines LDP, LDM and output nodes of the driver circuits DR1, DR2 of the FS driver 90, respectively. A value of each of the termination resistors RS1, RS2 is, for example, 45Ω. By the FS driver 90 outputting a low level as a GND level to one end of each of the termination resistors RS1, RS2, the resistors RS1, RS2 become to function as the termination resistors. The pull-down resistors RD1, RD2 are disposed between the signal lines LDP, LDM and a GND node, respectively. It should be noted that the termination resistors RS1, RS2 and the pull-down resistors RD1, RD2 are not required to be incorporated in the circuit device 10, and can be external components.

The circuit device 150 at the device side includes an HS driver 160, an FS driver 170, termination resistors RS3, RS4, a pull-up resistor RU, and a switch SWU. The HS driver 160 is a transmission circuit in the HS mode of the USB, and current-drives the signal lines LDP, LDM with a current source 162. The termination resistors RS3, RS4 are disposed between the signal lines LDP, LDM and output nodes of the driver circuits DR3, DR4 of the FS driver 170, respectively. The pull-up resistor RU and the switch SWU are disposed between the power supply node and the signal line LDP.

Further, in the present embodiment, the circuit device 10 includes the amplitude detection circuit 40, the amplitude setting circuit 50, and the judgment circuit 60.

The amplitude detection circuit 40 detects a signal amplitude of a USB signal. For example, the amplitude detection circuit 40 detects the signal amplitude of the USB signal as at least one of a DP signal and a DM signal of the USB. For example, the amplitude detection circuit 40 has a voltage detection circuit, and detects voltage levels of the DP signal and the DM signal as the USB signal using the voltage detection circuit to thereby detect the signal amplitude. The voltage detection circuit can be realized by a comparator for comparing the voltages of, for example, the DP signal and the DM signal with a judgment voltage. As the judgment voltage, it is possible to use, for example, a disconnection detection threshold value of the device described later. Alternatively, it is possible to realize the voltage detection circuit with an A/D conversion circuit for performing A/D conversion of the voltages of the DP signal and the DM signal, a judgment circuit for comparing A/D conversion result data of the A/D conversion circuit and judgment voltage data with each other, and so on.

It should be noted that as the amplitude detection circuit 40, it is possible to use a disconnection detection circuit 414 explained with reference to FIG. 4, FIG. 5, and so on described later. The disconnection detection circuit 414 is a circuit for performing disconnection detection of the USB. Specifically, the disconnection detection circuit 414 is a circuit for detecting device disconnection in which a device apparatus is detached from the USB. The disconnection detection circuit 414 detects the voltage levels of the DP signal and the DM signal to thereby detect the device disconnection. When adopting this process, it becomes possible to detect the signal amplitude of the USB signal making efficient use of the disconnection detection circuit 414 which is provided for detecting the device disconnection of the USB, and thus, it is possible to realize reduction in scale and so on of a circuit.

The amplitude setting circuit 50 is a circuit for setting the signal amplitude of the USB signal. For example, the amplitude setting circuit 50 sets an amplitude setting value of the signal amplitude of the USB signal to thereby set the signal amplitude. Specifically, the amplitude setting circuit 50 changes the amplitude setting value to thereby change the signal amplitude of the USB signal.

For example, in FIG. 1, the HS driver 20 has the current source 22 for outputting a variable transmission current. Further, the amplitude setting circuit 50 sets a value of the transmission current of the current source 22 as the amplitude setting value to thereby set the signal amplitude of the USB signal. For example, by the amplitude setting circuit 50 performing setting of increasing the transmission current value, currents flowing through the termination resistors RS1, RS2 increase, and thus, the signal amplitudes of the DP signal and the DM signal increase. When adopting this process, by controlling the transmission current value of the current source 22 provided to the HS driver 20, it becomes possible to vary the signal amplitudes of the DP signal and the DM signal.

In contrast, in FIG. 2, the amplitude setting circuit 50 sets values of the termination resistors RS1, RS2 of the USB as the amplitude setting value to thereby set the signal amplitude of the USB signal. For example, by the amplitude setting circuit 50 performing setting of increasing the values of the termination resistors RS1, RS2, a voltage difference between both ends of the termination resistors RS1, RS2 increases, and thus, the signal amplitudes of the DP signal and the DM signal increase. When adopting this process, by controlling the values of the termination resistors RS1, RS2 of the USB, it becomes possible to vary the signal amplitudes of the DP signal and the DM signal.

The judgment circuit 60 performs judgment process based on the detection result in the amplitude detection circuit 40. For example, as described later, the amplitude setting circuit 50 varies the signal amplitudes of the DP signal and the DM signal with the amplitude setting value in the detection period. For example, the amplitude setting circuit 50 increases the signal amplitudes of the DP signal and the DM signal. Then, the judgment circuit 60 determines the amplitude setting value to be used by the amplitude setting circuit 50 when performing the HS communication based on the detection result by the amplitude detection circuit 40 during the detection period. For example, by the amplitude setting circuit 50 setting the amplitude setting value, the voltages of the DP signal and the DM signal change, and when the voltages exceed the judgment voltage, the amplitude detection circuit 40 activates a detection signal. Then, the judgment circuit 60 determines the amplitude setting value to be used by the amplitude setting circuit 50 when performing the HS communication based on the amplitude setting value when the detection signal is activated. For example, the judgment circuit 60 determines the amplitude setting value to be used when performing the HS communication based on the amplitude setting value when the detection signal is activated and the margin value described later.

As described above, in the present embodiment, the amplitude setting circuit 50 varies the signal amplitude of the USB signal, and the amplitude detection circuit 40 detects the signal amplitude of the USB signal. Specifically, in the detection period, when the amplitude setting circuit 50 varies the signal amplitude of the USB signal using the amplitude setting value, the amplitude detection circuit 40 detects the signal amplitude of the USB signal at a transmission node at the host side. Then, the judgment circuit 60 determines the amplitude setting value to be used by the amplitude setting circuit 50 when performing the HS communication based on the detection result by the amplitude detection circuit 40 during the detection period. In other words, when performing the HS communication, the amplitude setting circuit 50 sets the signal amplitude of the USB signal using the amplitude setting value determined during the detection period to make the HS transmission be performed using the USB signal. For example, in the case of FIG. 1, the amplitude setting circuit 50 sets the transmission current of the current source 22 using the transmission current value as the amplitude setting value thus determined to make the HS communication of the USB with this transmission current be performed. In the case of FIG. 2, the amplitude setting circuit 50 sets the values of the termination resisters RS1, RS2 using the resistance value as the amplitude setting value thus determined to make the HS communication of the USB be performed.

When adopting this configuration, it is possible to determine the amplitude setting value to be used when performing the HS communication based on the detection result in the amplitude detection circuit 40 when varying the signal amplitude of the USB signal during the detection period. For example, it is possible to determine the amplitude setting value with which the signal amplitude does not exceed a predetermined amplitude value. Further, by setting the signal amplitude of the USB signal using the amplitude setting value thus determined to perform the HS communication, it becomes possible to realize the HS communication with an appropriate signal amplitude. For example, it becomes possible to realize the HS communication with such a signal amplitude as not to exceed a predetermined amplitude, and it becomes possible to realize both of prevention of occurrence of a problem caused by an increase in the signal amplitude, and the HS communication with a larger signal amplitude.

Figure 3:
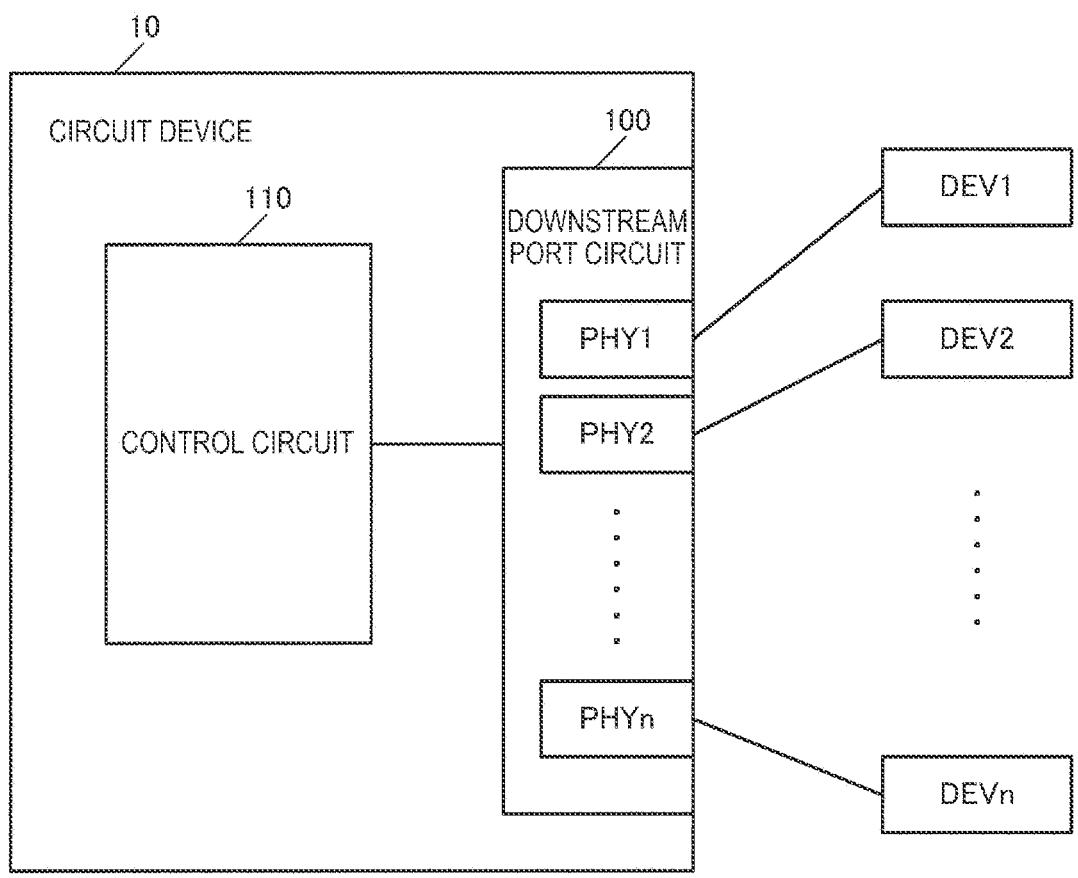
FIG. 3 is a diagram showing a specific configuration example of the circuit device.

FIG. 3 shows a specific configuration example of a circuit device 10 according to the present embodiment. In FIG. 3, the circuit device 10 operates as a host controller of the USB. It should be noted that the circuit device 10 can be a circuit device of a hub of the USB. In this case, it is sufficient to further provide an upstream port circuit to the circuit device 10.

The circuit device 10 includes a downstream port circuit 100 and a control circuit 110. The control circuit 110 is a circuit which performs control and so on of the downstream port circuit 100. The control circuit 110 can be realized by an ASIC (Application Specific Integrated Circuit) with automatic arrangement wiring such as a gate array, or a processor such as an MPU or a CPU. The control circuit 110 performs a variety of types of control processing and signal processing for operating as a host controller or a hub of the USB. When the circuit device 10 is the host controller, the control circuit 110 performs host processing in accordance with a system such as EHCI (Enhanced Host Controller Interface), XHCI (Extensible Host Controller Interface), OHCI (Open Host Controller Interface), or UHCI (Universal Host Controller Interface). It should be noted that it is possible to perform host processing compliant with a vender-specific standard. Further, when the circuit device 10 is a circuit device of the hub of the USB, the control circuit performs conversion processing of a transaction, logic processing of a hub repeat, and so on.

The downstream port circuit 100 includes physical layer circuits PHY1, PHY2, . . . , PHYn as port circuits for downstream. The physical layer circuits PHY1, PHY2, . . . , PHYn are coupled to the device apparatuses DEV1, DEV2, . . . , DEVn via the USB, respectively. The HS driver 20, the amplitude detection circuit 40, the amplitude setting circuit 50, the judgment circuit 60, and so on shown in FIG. 1 and FIG. 2 are disposed in each of these physical layer circuits PHY1 through PHYn. It should be noted that the amplitude detection circuit 40 is disposed in each of the physical layer circuit PHY1 through PHYn as a disconnection detection circuit 414 described later. Further, the judgment circuit 60 and so on can be provided to the control circuit 110. Further, the physical layer circuits PHY1 through PHYn can each include an HS receiver as a receiving circuit in the HS mode, an FS receiver as a receiving circuit in the FS mode, a single-end receiver as a single-ended receiving circuit, and so on besides the HS driver 20, the amplitude detection circuit 40, the amplitude setting circuit 50, and the judgment circuit 60. Further, the downstream port circuit 100 performs processing in a link layer such as a serial/parallel conversion process of converting serial data received via the USB into parallel data, a parallel/serial conversion process of converting parallel data into serial data, or processing of NRZI.

Then, a problem caused by increasing the signal amplitude of the USB signal will be described in detail. Specifically, a problem of a false detection of the device disconnection caused by increasing the signal amplitude of the USB signal will be described.

Figure 4:
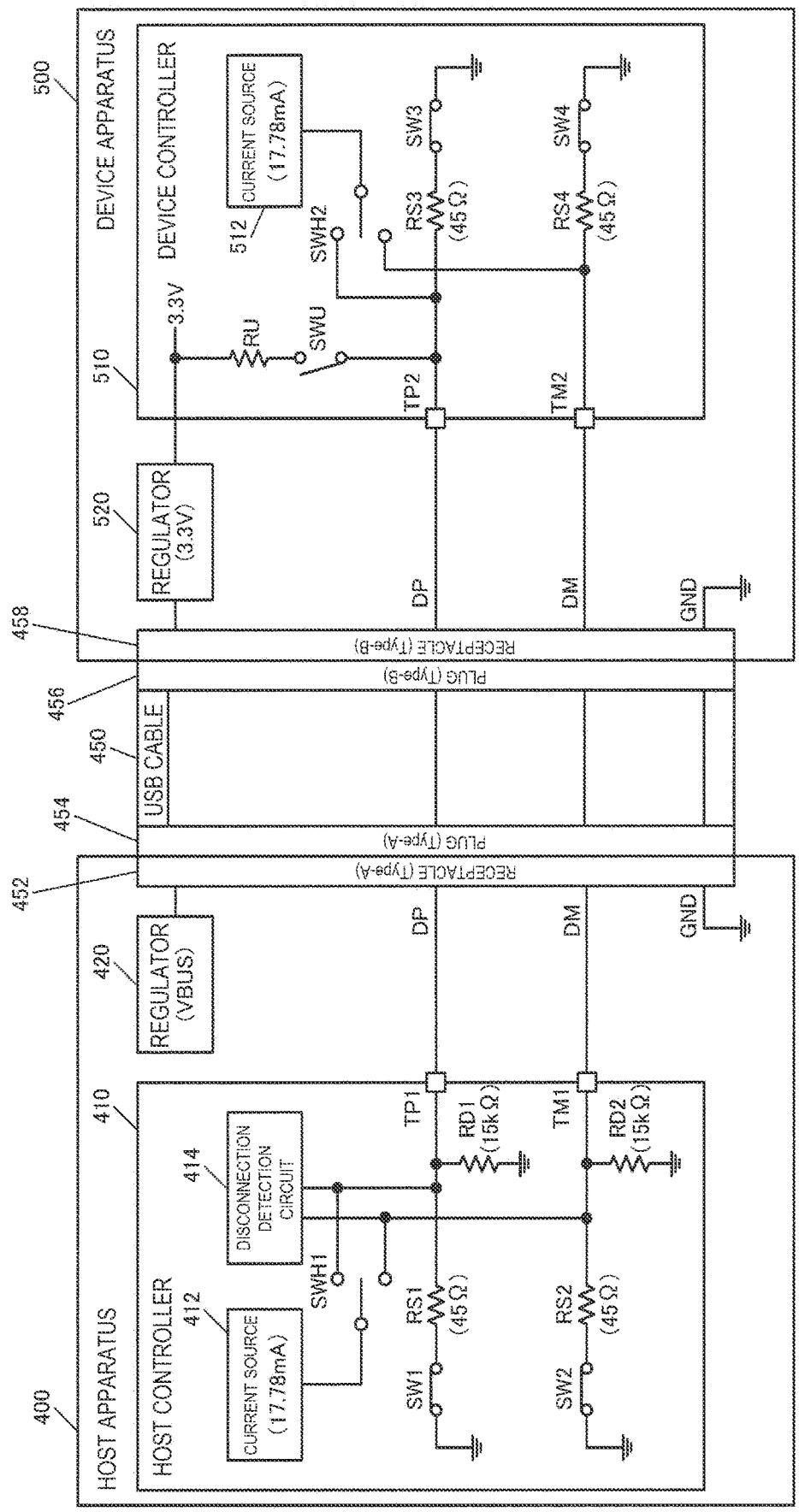
FIG. 4 is a diagram showing a connection configuration example between a host and a device.

FIG. 4 shows a configuration example when connecting a device in the USB apparatus. The signal lines of the DP, DM signals in the host apparatus 400 are laid from the termination resistors RS1, RS2 of 45Ω disposed inside the host controller 410 to terminals of the DP, DM signals in a receptacle 452 of Type-A via terminals TP1, TM1 of the DP, DM signals. It should be noted that the switches SW1, SW2 disposed between one ends of the termination resistors RS1, RS2 and the GND node are each realized by the FS driver 90 in FIG. 1 and FIG. 2. Further, the host controller 410 is provided with a switch SWH1 for selecting which one of the signal lines of the DP, DM signals the drive current from the current source 412 is output to, and the disconnection detection circuit 414 for performing the disconnection detection of the USB. As described above, the disconnection detection circuit 414 corresponds to the amplitude detection circuit 40 in FIG. 1 and FIG. 2. Further, the host apparatus 400 is provided with a regulator 420 for generating a voltage of VBUS.

The signal lines of the DP, DM signals in the device apparatus 500 are laid from the termination resistors RS3, RS4 of 45Ω disposed inside the device controller 510 to terminals of the DP, DM signals in a receptacle 458 of Type-B via terminals TP2, TM2 of the DP, DM signals. Further, a plug 454 of the Type-A of the USB cable 450 is connected to the host apparatus 400, and a plug 456 of the Type-B of the USB cable 450 is connected to the device apparatus 500. It should be noted that the switches SW3, SW4 disposed between one ends of the termination resistors RS3, RS4 and the GND node are each realized by the FS driver 170 in FIG. 1 and FIG. 2. Further, the device controller 510 is provided with a switch SWH2 for selecting which one of the signal lines of the DP, DM signals the drive current from the current source 512 is output to. Further, the device apparatus 500 is provided with a regulator 520 for generating a voltage of 3.3 V based on the voltage of VBUS. It should be noted that in the present embodiment, the host apparatus 400 and the host controller 410 are arbitrarily described simply as a host, and the device apparatus 500 and the device controller 510 are arbitrarily described simply as a device.

In the configuration example shown in FIG. 4, assuming a wiring resistance on the circuit board and an internal resistance of the USB cable 450 as 0Ω, an amplitude of an HS packet of the signal lines of the DP, DM signals of the USB become as follows.

That is, when connecting the device, the drive current from the current source 412 of the host apparatus 400 flow through both of the termination resistors RS1, RS2 of the host apparatus 400 and the termination resistors RS3, RS4 of the device apparatus 500. Therefore, when the transmission current value in the HS mode is 17.78 mA as the nominal value, the amplitude of the HS packet becomes as follows.

$$((45\ \Omega \times 45\Omega)/(45\ \Omega + 45\Omega)) \times 17.78\ \text{mA} = 22.5\ \Omega \times 17.78\ \text{mA} = 400.05\ \text{mV}$$

In contrast, when disconnecting the device, since the drive current from the current source 412 flows only through the termination resistors RS1, RS2 of the host apparatus 400, the amplitude of the HS packet becomes as follows.

$$45\ \Omega \times 17.78\ \text{mA} = 800.1\ \text{mV}$$

Further, the host controller 410 is provided with the disconnection detection circuit 414 for detecting the disconnection of the device apparatus 500 when performing the HS communication. A disconnection detection threshold value VDIS used by the disconnection detection circuit 414 for determining the disconnection is defined in the USB specification to become within a range of 525 mV through 625 mV. Therefore, by setting the judgment voltage for the disconnection detection by the disconnection detection circuit 414 within the range of 525 mV through 625 mV as the range of the disconnection detection threshold value VDIS, it becomes possible to perform the disconnection detection of the device apparatus 500. Specifically, when the device apparatus 500 is coupled, the amplitude of an EOP (End Of Packet) of an SOF (Start Of Frame) Packet becomes, for example, 400.05 mV, and therefore, the disconnection detection circuit 414 determines that the device disconnection is not detected. In contrast, when the connection of the device apparatus 500 is cut, the amplitude of the EOP becomes, for example, 800.1 mV, and therefore, the disconnection detection circuit 414 determines that the device disconnection has been detected.

Meanwhile, in recent years, it has become that there are provided a variety of components to the circuit board of the USB apparatus. FIG. 5 shows a configuration example when connecting a device in such a USB apparatus. The signal line of the DP signal in the host apparatus 400 is laid from the termination resistor RS1 to an obverse terminal for the DP signal and a reverse terminal for the DP signal of a receptacle 462 of Type-C via the terminal TP1 for the DP signal, a feed control IC 422, and a protective component 424. The signal line of the DM signal in the host apparatus 400 is laid from the termination resistor RS2 to an obverse terminal for the DM signal and a reverse terminal for the DM signal of the receptacle 462 via the terminal TM1 for the DM signal, the feed control IC 422, and the protective component 424.

As the feed control IC 422 of the host apparatus 400, there is used what is compliant with a BC specification (Battery Charging Specification) of the USB, and the host and the device set up a deal on the supply power with a unique protocol before connection of the USB is performed. As the protective component 424 of the host apparatus 400, there is used a component aimed at an electrostatic protection, a protection against a short-circuit to a high-potential side power supply line, a ground fault protection, and so on.

The signal line of the DP signal in the device apparatus 500 is laid from the termination resistor RS3 to an obverse terminal for the DP signal and a reverse terminal for the DP signal of a receptacle 468 of the Type-C via the terminal TP2 for the DP signal, a feed control IC 522, and a bus switch IC 524. The signal line of the DM signal in the device apparatus 500 is laid from the termination resistor RS4 to an obverse terminal for the DM signal and a reverse terminal for the DM signal of the receptacle 468 via the terminal TM2 for the DM signal, the feed control IC 522, and the bus switch IC 524.

The feed control IC 522 of the device apparatus 500 is used for setting up a deal on the supply power similarly to the feed control IC 422 in the host apparatus 400. The bus switch IC 524 of the device apparatus 500 is used for selecting either one of the obverse terminals (the obverse terminal for the DP signal/the obverse terminal for the DM signal) and the reverse terminals (the reverse terminal for the DP signal/the reverse terminal for the DM signal) of the receptacle 468. Further, a plug 464 of the Type-C of the USB cable 450 is connected to the host apparatus 400, and a plug 466 of the Type-C of the USB cable 450 is connected to the device apparatus 500.

Figure 5:
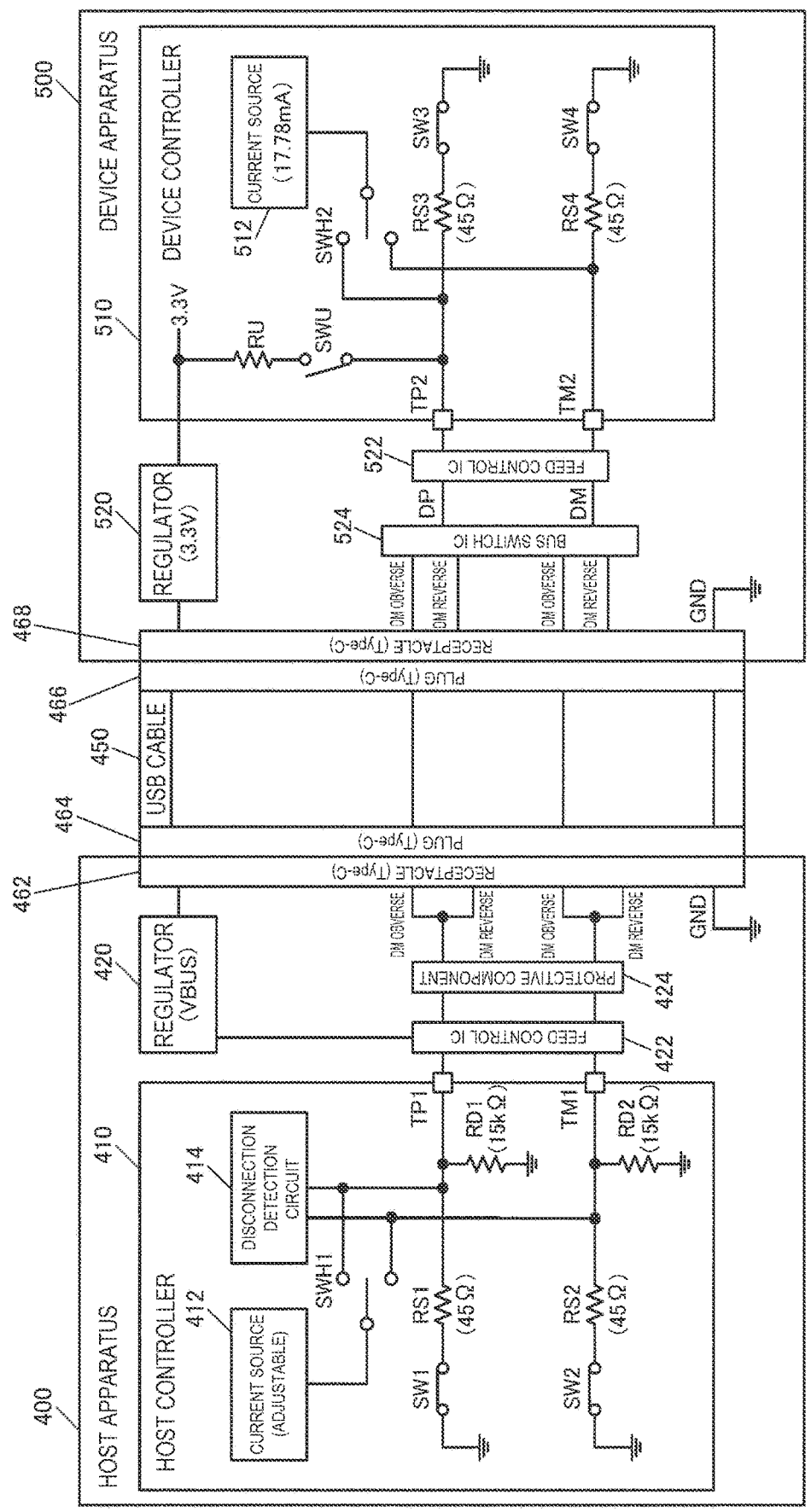
FIG. 5 is a diagram showing a connection configuration example between the host and the device.

In the configuration example shown in FIG. 5, since the variety of components are added to the signal lines of the DP, DM signals between the host and the device compared to the configuration example shown in FIG. 4, there arises a necessity of considering internal resistances of these components in addition to the termination resistors RS1, RS2, RS3, and RS4.

In the configuration example shown in FIG. 5, assuming the internal resistance of each of the components installed in the host apparatus 400 and the device apparatus 500 as 20Ω, an amplitude of the HS packet of the signal lines of the DP, DM signals of the USB become as follows.

That is, when connecting the device, the drive current flow through the termination resistors RS1, RS2, RS3, and RS4 and the internal resistances of the components in both of the host apparatus 400 and the device apparatus 500. Therefore, the amplitude of the HS packet becomes as follows.

$$((45\Omega \cdot (45\ \Omega + 20\ \Omega + 20\Omega)/(45\Omega + (45\ \Omega + 20\ \Omega + 20\Omega))) \times 17.78\ \text{mA} = 29.423\ \Omega \times 17.78\ \text{mA} = 523.14\ \text{mV}$$

In contrast, when disconnecting the device, since the drive current from the current source 412 flows only through the termination resistors RS1, RS2 of the host apparatus 400, the amplitude of the HS packet becomes as follows.

$$45\ \Omega \times 17.78\ \text{mA} = 800.01\ \text{mV}$$

Further, as described above, the disconnection detection threshold value VDIS used by the disconnection detection circuit 414 for determining the disconnection is defined to become within the range of 525 mV through 625 mV. Therefore, in the configuration example shown in FIG. 5, when setting the judgment voltage for the disconnection detection in the disconnection detection circuit 414 around 525 mV as a lower limit value of the disconnection detection threshold value, the amplitude of the EOP of the SOF packet reaches 523.14 mV when connecting the device as described above, and therefore, there is a possibility that there occurs a false detection of the disconnection while the device is coupled. Further, when the host controller 410 increases the drive current to be higher than 17.78 mA in order to compensate the attenuation of the signal level by the USB cable 450, the amplitude of the EOP further increases, and therefore, the possibility that the false detection of the disconnection is made increases.

Figure 6:
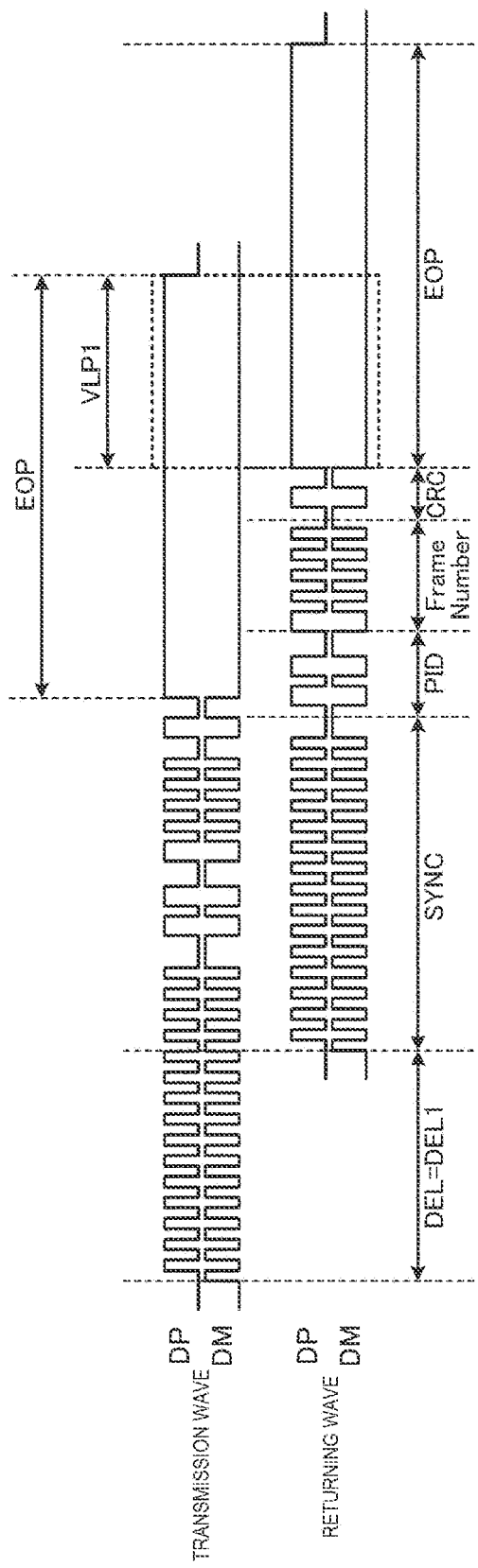
FIG. 6 is an explanatory diagram of a problem caused by a returning wave overlapping a transmitted wave.
Figure 7:
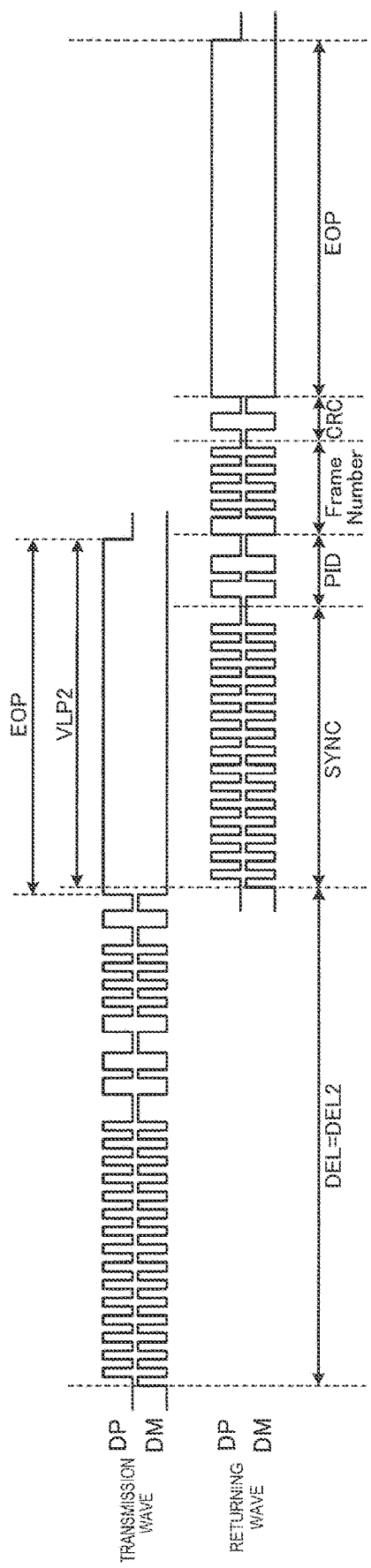
FIG. 7 is an explanatory diagram of a problem caused by the returning wave overlapping the transmitted wave.

It is conceivable to set the judgment voltage for the disconnection detection around 625 mV as an upper limit value of the disconnection detection threshold value in order to prevent the false detection of the disconnection, but in this case, to the contrary, there is a possibility that the disconnection detection does not work when the device is disconnected due to the influence of a returning wave depending on the cable length of the USB cable 450. FIG. 6 and FIG. 7 are each an explanatory diagram of the influence of the returning wave depending on the cable length. The device disconnection mentioned here is defined as a state in which a plug 456 of the USB cable 450 is pulled out from the receptacle 458 of the device apparatus 500 in the configuration example shown in FIG. 4. In this case, there is created the state in which the USB cable 450 is kept connected to the host apparatus 400.

When the HS termination as the termination of 45Ω is lost by the device disconnection, the returning wave is superimposed on the EOP of the SOF packet to be detected by the host. FIG. 6 shows when the cable length of the USB cable 450 is short, and the delay DEL=DEL1 of the returning wave is small, and FIG. 7 shows when the cable length is long, and the delay DEL=DEL2 of the returning wave is large. In FIG. 6, since the cable length is short and the delay DEL is small, a superimposed part VLP1 as a temporally superimposed part exists between the EOP of the transmission wave of the host and the EOP of the returning wave. Further, in the superimposed part VLP1, since the signal amplitude of the EOP does not decrease, it is possible for the host to detect the device disconnection. In contrast, in FIG. 7, since the cable length is long and the delay DEL is large, the superimposed part does not exist between the EOP of the transmission wave of the host and the EOP of the returning wave. Further, in FIG. 7, the EOP of the transmission wave of the host is superimposed on a SYNC and a PID of the returning wave in a superimposed part VLP2. Therefore, there is a possibility that in the superimposed part VLP2, the signal amplitude of the EOP is prevented from rising in terms of DC, and thus the host is made unable to detect the device disconnection. Specifically, when the EOP of the transmission wave and the SYNC and the PID of the returning wave are superimposed in the superimposed part VLP2, the signal amplitude of the EOP of the transmission wave decreases to fail to keep 800 mV as a normal amplitude when disconnected, but approach 625 mV as the upper limit value of the disconnection detection threshold value. Therefore, when the judgment voltage for the disconnection detection in the disconnection detection circuit 414 is set around 625 mV as the upper limit value of the disconnection detection threshold value, there is a possibility that it becomes unachievable for the host to detect the device disconnection.

As described hereinabove, in the USB apparatus, the optimum judgment voltage of the disconnection detection threshold value becomes different by the conditions such as the internal resistance of the component installed in the host apparatus 400 and the device apparatus 500 and the length of the USB cable 450 used for the connection. On the other hand, since the USB specification is a multi-purpose communication standard, the device apparatus 500 is coupled to the host apparatus 400 in a variety of conditions, and depending on the connection conditions, there arises a problem that the device disconnection is falsely detected although the device apparatus 500 is coupled, or a problem that the device disconnection fails to be detected although the connection of the device apparatus 500 is cut.

On the other hand, as described above, there is the demand of setting the opening part of the eye pattern as wide as possible at the measurement point of the tip of the cable in order to make it possible for the device connected to the tip of the USB cable to surely receive a signal. In order to achieve such a demand, it is possible to adopt a method of transmitting the USB signal in the HS mode with a transmission current value in the HS mode set to a value higher than 17.78 mA as a nominal value in the USB specification.

However, when making the transmission current value in the HS mode higher than the normal value, the risk of the false detection of the device disconnection described above increases. In other words, the detection of the device disconnection in the USB uses the phenomenon that the disconnection loses the HS termination at one side to increase the signal amplitude of the HS packet to a value larger than that when the device is coupled. Specifically, there is adopted a mechanism in which the disconnection detection circuit 414 always detects the amplitude value of the HS packet, and the disconnection is assumed when the amplitude value thus detected exceeds the disconnection detection threshold value. Specifically, in the USB specification, it is stipulated that the disconnection detection threshold value as the disconnection detection level is set within the range of 525 mV through 625 mV. Therefore, when attempting to transmit a signal with an amplitude of 550 mV at the transmission end taking the attenuation into consideration when, for example, it is desired to obtain the amplitude of 500 mV at the reception end as the tip of the cable, there is a possibility that the disconnection detection circuit 414 at the transmission end reacts, and there occurs the false detection of the disconnection in which the disconnection is assumed despite the device is coupled.

In the disconnection detection, there are a variety of fluctuation factors to be considered. First, there is cited the termination resistance value in the HS mode of the connection counterpart. For example, in an in-car app or the like, there is a tendency that the resistance value increases by inserting the protection circuit against the electrostatic or the short-circuit to the high-potential side power supply line, the feed control circuit, or the like on the bus. Some exceed 49.50Ω as a maximum value of the resistance value in the USB specification. Second, there is cited a value of the parasitic resistance on a line path including the cable. This depends on the quality of the cable and the connector, and the longer the cable is, the higher the resistance value becomes. Third, an individual/temperature variation of the transmission current value and the disconnection detection threshold value in the HS mode. It is necessary to make the transmission current value in the HS mode small with a margin so that the false detection of the disconnection does not occur even when the amplitude increases due to a combination of the worst cases taking these fluctuation factors into consideration. Therefore, it is necessary to set the low transmission current value with a margin even when the connection is made in a combination difficult to cause the false detection of the disconnection in reality, and the false detection of the disconnection does not normally occur even when setting a higher transmission current value. The combination difficult to cause the false detection of the disconnection means a combination in which, for example, the termination resistance value in the HS mode of the connection counterpart is low, the parasitic resistance value on the line path is low, the transmission current value in the HS mode is low, and the disconnection detection threshold value is high. Therefore, as a result, there is a problem that it is unachievable to obtain a wide opening of the eye pattern at the tip of the cable.

In this regard, as related art of automatically setting the transmission current value in the HS mode in accordance with the device coupled, there is cited, for example, the technology disclosed in Document 1 described above. In Document 1, the amplitude is measured in the reception side apparatus located beyond the transmission path, and it is intended to perform an amplitude adjustment at the transmission side in order to make it possible for the reception side apparatus to surely receive the signal, and it is unachievable to deal with the risk that the disconnection detection circuit provided to the transmission side apparatus erroneously detects the disconnection. Further, it is necessary to transmit the amplitude measurement data from the reception side apparatus to the transmission side apparatus, but this interaction is not specified in the USB specification, and is therefore required to be performed with a vendor-unique request through the USB. Therefore, the transmission can only be performed when the reception side apparatus compatible with the method of this interaction is coupled, and it is unachievable to deal with a variety of devices such as a variety of smartphones.

In order to solve such a problem as described above, the circuit device 10 according to the present embodiment shown in FIG. 1 and FIG. 2 includes the HS driver 20, the amplitude detection circuit 40, the amplitude setting circuit 50, and the judgment circuit 60. Further, the amplitude setting circuit 50 varies the signal amplitude with the amplitude setting value in the detection period, and the judgment circuit 60 determines the amplitude setting value to be used by the amplitude setting circuit when performing the HS communication based on the detection result by the amplitude detection circuit 40 during the detection period. As described above, in the circuit device 10 according to the present embodiment, the amplitude setting value of the USB signal is increases or decreased to detect the amplitude of the USB signal, and thus, the optimum amplitude setting value of the transmission signal is automatically decided. In the case of FIG. 1, the transmission current value in the HS mode is increased or decreased as the amplitude setting value. In the case of FIG. 2, the value of each of the termination resistors RS1, RS2 is increased or decreased as the amplitude setting value. When adopting this process, it is possible to decide the transmission current value in the HS mode which is the best suited to both of the transmission side apparatus and the reception side apparatus coupled on the bus before the HS communication of actually transmitting/receiving the HS packet starts. Therefore, it becomes possible to previously set the amplitude value the best suited to the system actually coupled without depending on a variation in termination resistance value in the HS mode at the connection counterpart and a variation in transmission current value and disconnection detection threshold value in the HS mode.

Further, in the present embodiment, the disconnection detection circuit 414 provided to the transmission side apparatus such as the host is used for the detection of the amplitude of the USB signal. In other words, by performing the detection of the amplitude using the disconnection detection circuit 414 for actually performing the detection of the device disconnection, it becomes possible to set the signal amplitude of the USB signal as large as possible within a range in which the false detection of the disconnection surely fails to occur. In addition, there is an advantage that it is not required to prepare another circuit in order to measure the amplitude, and thus, the circuit scale can be reduced.

It should be noted that in the related art in Document 1 described above, the amplitude is measured in the connection counter part located beyond the cable. In other words, it attaches a high value to the fact that the signal attenuated by the cable can surely be received. In contrast, in the present embodiment, a high value is attached to the fact that the problem such as the false detection of the disconnection does not occur, and it is arranged that the signal amplitude of the USB signal is set as large as possible within the range in which that problem does not occur, and is therefore different in problem to be solved.

2. Amplitude Setting

Figure 8:
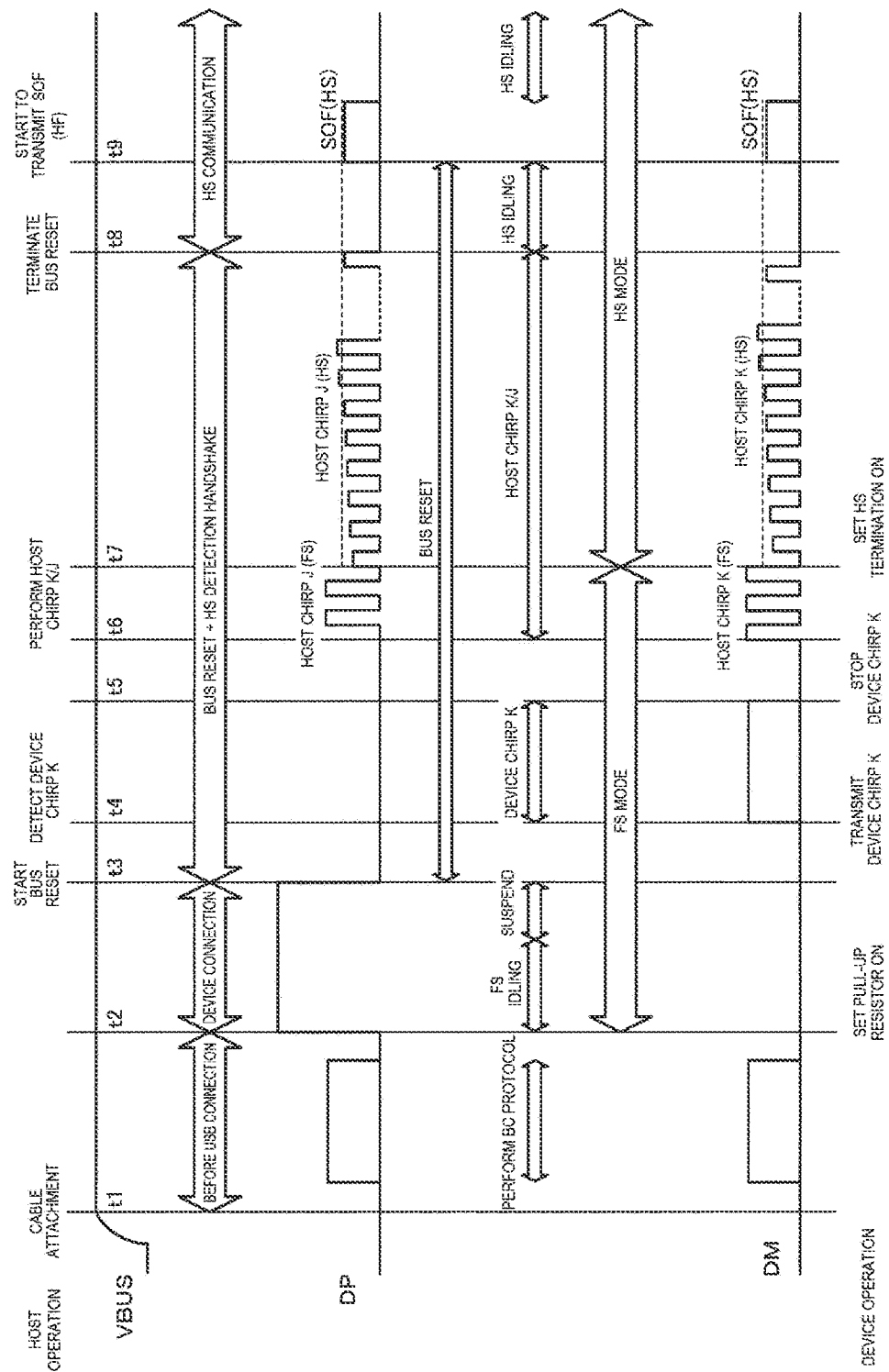
FIG. 8 is a timing waveform chart for explaining an operational example in the embodiment.

Then, a detailed operation in the present embodiment will be described using a timing waveform chart shown in FIG. 8. As shown in FIG. 8, after cable attachment in which the host and the device are coupled to each other, and before the USB connection is performed, feed control ICs of the host and the device set up (timing t1) a deal on the supply power from the host to the device with a BC protocol as a unique protocol.

In order to give notice of the connection to the host, the device sets the pull-up resistor of 1.5 kΩ ON to thereby set the signal line of the DP signal of the USB to 3.3 V (FS_J) to make the transition (timing t2) to FS idling. The host detects this state to thereby determine that the device is coupled.

When starting the communication with the device thus coupled, the host sets the termination resistor ON to thereby set the signal lines of the DP, DM signals of the USB to 0 V (SE0) to start (timing t3) bus reset. The device detects this state to thereby determine that the connection of the device is recognized by the host.

In order to notify the host of the fact that the device is compatible with the HS mode, the device couples the current source to the signal line of the DM signal to thereby set the signal line of the DM signal to 800 mV to transmit (timing t4) a device chirp K. The host detects this state to thereby determine that the device coupled is compatible with the HS mode.

When starting the HS connection to the device, the host couples the current source alternately to the signal line of the DP signal and the signal line of the DM signal to thereby alternately set the signal lines of the DP, DM signals to 800 mV to transmit (timing t6) a host chirp K/J (FS). The device detects this state to thereby determine that the host recognizes the fact that the device is compatible with the HS mode.

In order to notify the host of the fact that the device is capable of performing the HS communication, the device sets the termination resistor ON to thereby set a voltage level at the high potential side of the signal lines of the DP, DM signals to 400 mV to show (timing t7) the host chirp K/J (HS). The host detects this state to thereby determine that the device coupled is capable of performing the HS communication.

When starting the HS communication with the device, the host stops the host chirp K/J (HS) to thereby set the signal lines of the DP, DM signals to 0 V (SE0) to terminate (timing t8) the bus reset. Subsequently, the host transmits a variety of types of HS packets including an SOF packet to the device to thereby perform the HS communication with the device.

It should be noted that in the present embodiment, the host chirps at the timings t6 through t7 shown in FIG. 8 are assumed as the host chirps in the FS mode, and are described as the host chirp K (FS), the host chirp J (FS), the host chirp K/J (FS), and so on. Further, the host chirps at the timings t7 through t8 are assumed as the host chirps in the HS mode, and are described as the host chirp K (HS), the host chirp J (HS), the host chirp K/J (HS), and so on. This is because it is fixed that both of the host and the device are compatible with the HS mode, and the transition of the transfer mode of the USB from the FS mode to the HS mode has been made at the timing t7. Further, the host chirp means what is defined as a hub chirp in the USB specification, but in the present embodiment, what is supposedly output by the downstream port of the hub is also described integrally as the host chirp for the sake of understandability.

Figure 9:
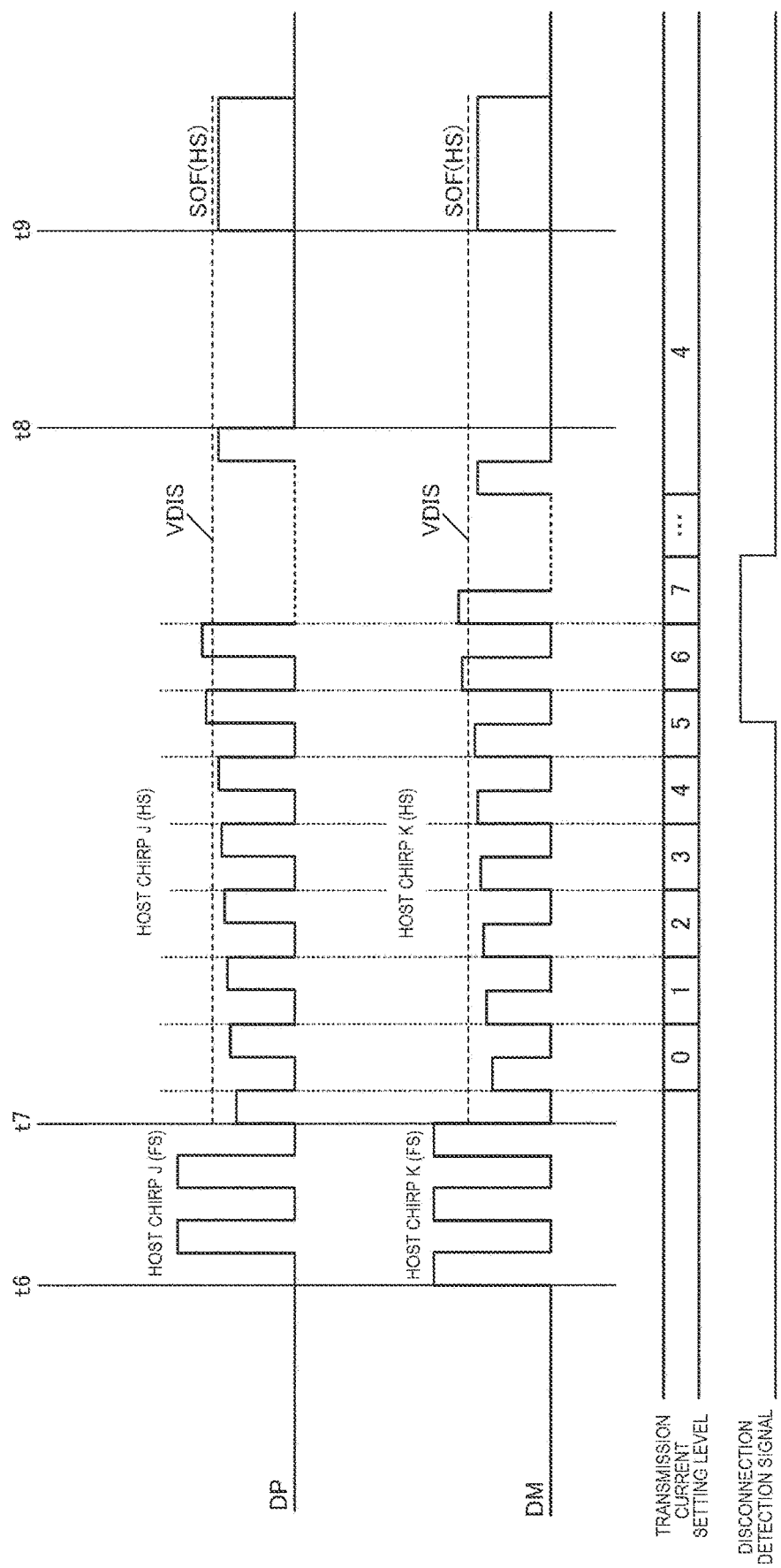
FIG. 9 is a detailed timing waveform chart for explaining an operational example in the embodiment.

Further, in the present embodiment, the amplitude setting circuit 50 changes the amplitude setting of the USB signal in the detection period as a period for the HS driver 20 to transmit the host chirp in the state in which the HS termination is ON. Specifically, a portion of the host chirp K (HS) and a portion of the host chirp J (HS) out of an HS detection handshake shown in FIG. 8 are used in the present embodiment. FIG. 9 shows a timing waveform chart in which the portion of the host chirp K/J and the portion of the HS idling shown in FIG. 8 are enlarged.

On and after the timing t7 shown in FIG. 8 and FIG. 9, the current source 22 of the HS driver 20 alternately make the transmission current flow into the signal line of the DM signal and the signal line of the DP signal in the state in which the HS termination resistor in both of the host and the device is ON. The timing of the host chirp K (HS) and the timing of the host chirp J (HS) are each fixed to 40 μs through 60 μs in the USB specification. The timing is created by a host chirp generation circuit not shown. On this occasion, the amplitude setting circuit 50 which functions as a current source control circuit outputs an instruction signal for setting the transmission current value in the HS mode to the current source 22 in sync with the host chirp timing. In accordance with this instruction signal, the current source 22 increases the transmission current value in the HS mode every reciprocal action of the host chirps K (HS)/J (HS) as shown in FIG. 9. In other words, in the period from the timing t7 to the timing t8 as the detection period, the amplitude setting circuit 50 varies the transmission current value as the amplitude setting value of the DP signal and the DM signal to vary the amplitudes of the DP signal and the DM signal in the detection period. Specifically, in FIG. 9, the current source 22 is made capable of outputting the transmission current at eight setting levels from a level 0 to a level 7. The level 0 corresponds to the lowest transmission current value, and the level 7 corresponds to the highest transmission current value. For example, when assuming the transmission current value at the level 0 as I0, the transmission current values at the levels 1, 2, 3, . . . , 7 are I0+Δi, I0+2×Δi, I0+3×Δi, . . . , I0+7×Δi, respectively. The symbol Δi denotes a current value within a range of, for example, 0.2 mA through 0.8 mA. The setting level of the transmission current corresponds to the amplitude setting value. Thus, as shown in FIG. 9, the setting level of the transmission current reaches to the level 7 from the level 0 with the 8 reciprocal actions of the host chirps K (HS)/J (HS), and as a result, the amplitudes of the DP signal and the DM signal increase.

The amplitude detection circuit 40 as the disconnection detection circuit 414 detects the amplitudes of the DP signal and the DM signal to output the disconnection detection signal as the detection result. Then, the judgment circuit 60 determines the amplitude setting value to be used by the amplitude setting circuit 50 when performing the HS communication based on the disconnection detection signal as the detection result during the detection period. Specifically, the amplitude detection circuit 40 outputs the disconnection detection signal at an L level as an inactive level during a period in which an absolute value of the amplitude of each of the DP signal and the DM signal does not exceed the disconnection detection threshold value VDIS. Then, when the absolute value of the amplitude of each of the DP signal and the DM signal exceeds the disconnection detection threshold value VDIS, the amplitude detection circuit 40 outputs the disconnection detection signal at an H level as an active level. In the example shown in FIG. 9, when the setting level of the transmission current becomes at the level 5, the host chirp K (HS) does not exceed the disconnection detection threshold value VDIS, but the host chirp J (HS) exceeds the disconnection detection threshold value VDIS. On this occasion, it is determined that the level 4 is the highest level at which the false detection of the disconnection occurs neither in the host chirp K (HS) nor in the host chirp J (HS), and therefore, the HS communication following the HS detection handshake is performed in the state in which the setting level of the transmission current in the HS mode to the level 4. In other words, the judgment circuit 60 determines that the transmission current value as the amplitude setting value to be used by the amplitude setting circuit 50 when performing the HS communication is the level 4 based on the disconnection detection signal as the detection result of the amplitude detection circuit 40. Therefore, as shown on and after the timing t8 in FIG. 9, the setting level of the transmission current when performing the HS communication is set to the level 4. It should be noted that it is possible to set the setting level of the transmission current when performing the HS communication to be lower than the level 4 with a margin using a margin value described with reference to FIG. 12 described later. Then, subsequently, the setting level of the transmission current in the HS mode is reset to 0 at the timing of the detection of the disconnection of the device or the subsequent cable attachment. Specifically, the amplitude setting value is reset.

It should be noted that in accordance with the regulation of the HS detection handshake in the USB specification, the host chirp K (HS)/J (HS) continues for about 17 or more reciprocal actions. Therefore, when there are eight setting levels of the transmission current in the HS mode as in the present embodiment, it becomes possible to make trials of the HS current transmission at all of the setting levels during the host chirp period.

Hereinabove, there is described a first method for the amplitude setting circuit 50 to vary the signal amplitude of the USB signal using the period in which the HS driver 20 transmits the host chirp as the detection period. In the case of the first method, it is sufficient to provide the circuit device 10 with the host chirp generation circuit. Incidentally, in the present embodiment, it is possible to adopt a second method of varying the signal amplitude of the USB signal using the period in which the HS driver 20 transmits the SOF packet as the detection period. In the case of the second method, it is sufficient to provide the circuit device 10 with an SOF generation circuit.

Figure 10:
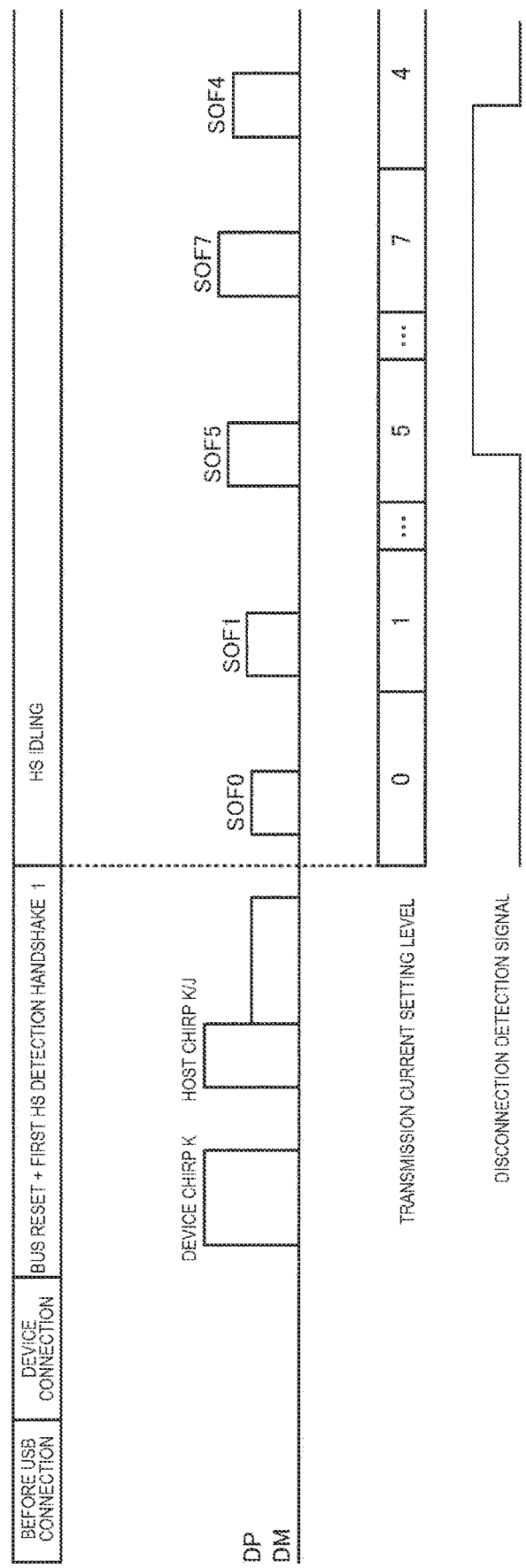
FIG. 10 is a timing waveform chart for explaining another operational example in the embodiment.
Figure 11:
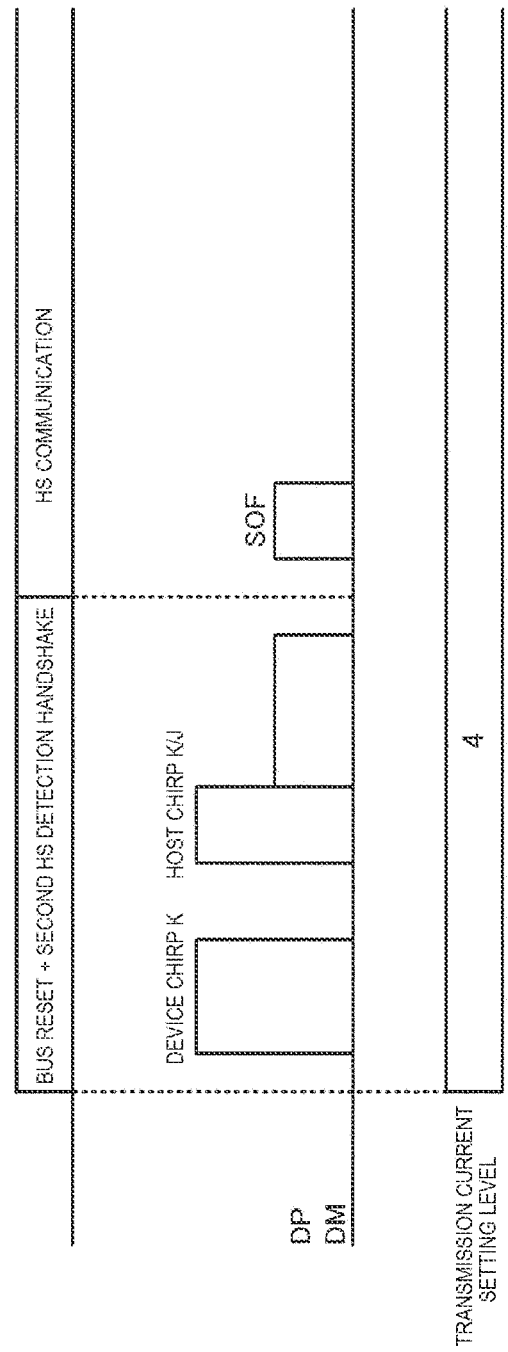
FIG. 11 is a timing waveform chart for explaining another operational example in the embodiment.

FIG. 10 and FIG. 11 are each a timing waveform chart for explaining the operation in the present embodiment in the second method. The operation from the cable attachment to the termination of the bus reset are substantially the same as in the first method described with reference to FIG. 8 and FIG. 9, and therefore, the description thereof will be omitted. Unlike the first method, in the second method, the setting level of the transmission current in the HS mode is fixed to 0 during the HS detection handshake. Further, after the termination of the bus reset, the SOF generation circuit not shown controls the current source 22 of the HS driver 20 to transmit the SOF packet. The SOF packet is transmitted with a period of once per 125 μs based on the USB specification. Although the EOP of one SOF packet is K or J, it is assumed in the present embodiment that the amplitude and the absolute value of the disconnection detection threshold value are substantially the same between K and J, and the absolute value of the amplitude of each of the DP signal and the DM signal is detected without distinguishing K and J from each other to determine the setting level of the transmission current in the HS mode. It is not required to transmit other packets than the SOF packet. On this occasion, the amplitude setting circuit 50 as the current source control circuit instructs the transmission current value in the HS mode to the current source 22 to set the signal amplitude in sync with the timing at which the SOF generation circuit generates the SOF packet. In accordance with this instruction signal, the current source 22 increases the setting level of the transmission current in the HS mode every time one SOF packet is transmitted to increase the transmission current value in the HS mode. In the second method, similarly to the first method described above, the current source 22 is made capable of outputting the transmission current in the HS mode at 8 setting levels from the level 0 to the level 7. Therefore, the setting level of the transmission current in the HS mode reaches the level 7 from the level 0 while transmitting 8 SOF packets, and as a result, the signal amplitude gradually increases. The amplitude detection circuit 40 as the disconnection detection circuit 414 takes the EOP of the SOF alone as the detection target, and keeps the disconnection detection signal in the L level during the period in which the absolute value of the amplitude of each of the DP signal and the DM signal does not exceed the disconnection detection threshold value, and sets the disconnection detection signal to the H level and then outputs the disconnection detection signal when the absolute value exceeds the disconnection detection threshold value. The example in FIG. 10 shows that when the setting level of the transmission current in the HS mode becomes the level 4, the absolute value of the amplitude of the SOF packet does not exceed the disconnection detection threshold value, but when the setting level becomes the level 5, the absolute value exceeds the disconnection detection threshold value. On this occasion, since it is determined that the level 4 is the highest level at which the false detection of the disconnection does not occur, the setting level of the transmission current in the HS mode is thereafter set to the level 4. Subsequently, it is possible to further transmit a pair of SOF packets at level 4 to confirm that the disconnection is not detected. Then, after determining the setting level of the transmission current in the HS mode in the series of procedures, the host starts the bus reset once again to perform the HS detection handshake, and then, starts the normal HS communication with the device as shown in FIG. 1.

As described above, in the present embodiment, after the judgment circuit 60 determines the amplitude setting value to be used for the HS communication as shown in FIG. 10, the bus reset is started once again to perform the HS detection handshake once again as shown in FIG. 11. Specifically, after the judgment circuit 60 determines the amplitude setting value to be used for the HS communication, the HS driver 20 transmits SE0 to thereby start the bus reset. When adopting this process, it becomes possible to perform the HS detection handshake once again to transmit an appropriate SOF packet to the device by performing the bus reset once again after determining the setting level of the transmission current in the HS mode as the amplitude setting value using the SOF packet transmitted in FIG. 10. It should be noted that also in FIG. 8 and FIG. 9, it is possible to arrange that the amplitude setting value is determined in the period of the host chirp in a first HS detection handshake, and then, the bus reset is performed once again to perform a second HS detection handshake.

It should be noted that it is possible for the host to start the normal HS communication with the device by directly starting to transmit other packets than the SOF packet without starting the bus reset after determining the setting level of the transmission current in the HS mode in the series of procedures. Alternatively, it is possible for the host to make the transition of the state of the device of the USB from a suspend state to a resume state, and then start the normal HS communication with the device instead of starting the bus reset. Further, it is possible to transmit either one of the SOF packet with the EOP=K and the SOF packet with the EOP=J alone to shorten the procedure of determining the setting level of the transmission current in the HS mode.

In the first method described with reference to FIG. 8 and FIG. 9, since the host chirp is used, there is an advantage of preventing the start of the actual HS communication from being delayed. In contrast, in the first method, since the setting level of the transmission current in the HS mode is not determined using the SOF packet to actually be used for the disconnection detection during the HS communication, there is a disadvantage that it is unachievable to take the influence of the returning wave on the disconnection detection into consideration. Since there is a concern that the false detection of the disconnection easily occur due to a noise caused by the returning wave, it is conceivable that it is necessary to lower the setting level of the transmission current in the HS mode as much as the margin value in the actual operation.

In contrast, in the second method described with reference to FIG. 10 and FIG. 11, since the SOF packet is used, there is a disadvantage that the start of the HS communication is delayed. On the other hand, in the second method, since the setting level of the transmission current in the HS mode is determined using the SOF packet to actually be used for the disconnection detection during the HS communication, there is an advantage that it is possible to take the influence of the returning wave on the disconnection detection into consideration. Since the setting level of the transmission current in the HS mode can be determined in the environment in which the returning wave exists, there is no need to provide the margin value, and it becomes possible to increase the transmission current in the HS mode to the highest possible level to make the signal amplitude greater.

Further, in the present embodiment, the description is presented mainly citing the method of varying the setting level of the transmission current in the HS mode to thereby vary the signal amplitude as an example, it is also possible to vary the values of the termination resistors RS1, RS2 to thereby vary the signal amplitude as described with reference to FIG. 2. In other words, as a method of increasing the signal amplitude, it is possible to adopt a method of increasing the values of the termination resistors RS1, RS2 coupled to the own FS driver 90. Regarding the method of varying the termination resistance values, it is possible to adopt a method of controlling the termination resistance values via a termination resistance control circuit as in the configuration disclosed in, for example, JP-A-2005-340945. The termination resistance values are increased stepwise in sync with the transmission of, for example, the host chirp or the SOF packet. When increasing the termination resistance values, the signal amplitude increases in tandem with the resistance values, and therefore, the amplitude detection circuit 40 detects the fact that the signal amplitude exceeds a threshold value of the amplitude in some step. It is sufficient to set the highest termination resistance values within a range in which the signal amplitude does not exceed the threshold value of the amplitude after detecting the fact that the signal amplitude exceeds the threshold value of the amplitude, and then start the HS communication.

Further, in the present embodiment, it is possible to set an upper limit value in the amplitude setting value. Further, the amplitude setting circuit 50 varies the amplitude setting value in the detection period until the amplitude setting value reaches the upper limit value thus set. For example, the setting level of the transmission current in the HS mode as the amplitude setting value is varied until the setting level reaches the upper limit value. When adopting this process, it is possible to prevent a circumstance in which the signal amplitude set by an automatic judgment based on the detection result of the amplitude becomes unnecessarily large to fail to become an appropriate signal amplitude corresponding to the use environment. As an example, by setting such an upper limit value, it becomes possible to prevent the signal amplitude at the connector position of the cable from exceeding the upper limit frame of the eye pattern. For example, in the automatic judgment based on the detection result of the amplitude, since the signal amplitude is set to be as large as possible, there is a possibility that the amplitude value at the tip of the cable exceeds the upper limit frame of the eye pattern depending on the length of the cable in the posterior stage. Therefore, it is possible to, for example, set the upper limit value of the setting level of the transmission current to, for example, the level 3, and to set the setting level of the actual transmission current to the level 3 even when the setting level of the transmission current according to the automatic judgment is the level 4.

Further, in the present embodiment, it is possible for the judgment circuit 60 to determine the amplitude setting value to be used by the amplitude setting circuit 50 when performing the HS communication based on the detection result by the amplitude detection circuit 40 and the margin value. For example, instead of directly using the amplitude setting value obtained based on the detection result of the amplitude, the amplitude setting value to be used when performing the HS communication is determined based on the amplitude setting value thus obtained and the margin value determined in advance. When adopting this configuration, it becomes possible to set the appropriate signal amplitude capable of dealing with a use situation, an environmental fluctuation, and so on. There is a possibility that reflection of the signal or the like occurs due to the state of the bus such as the length of the cable, and the amplitude value temporarily becomes larger than an intended value. Further, the amplitude or the disconnection detection threshold value is changed in some cases due to a temperature change after setting the amplitude. In preparation for such a case, the margin value is set to, for example, two levels in advance. For example, when the setting level of the transmission current judged automatically is the level 7, it is possible to set the actual setting level to the level 5 by subtracting the two levels as the margin value from the level 7.

Figure 12:
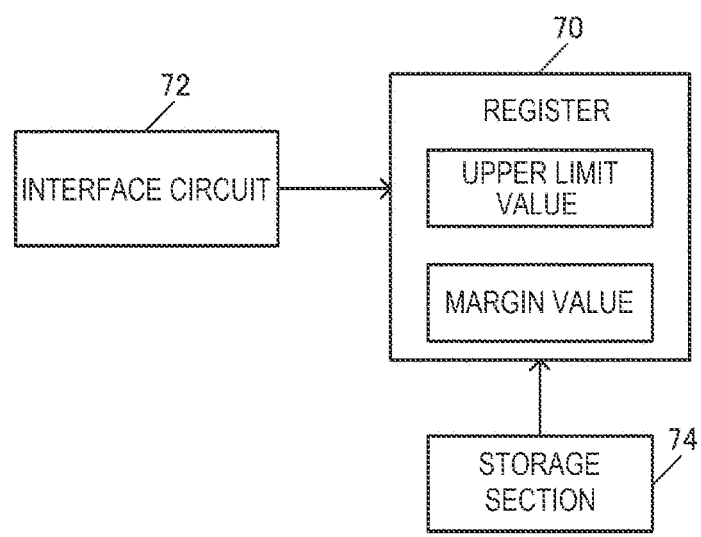
FIG. 12 is an explanatory diagram of a method of setting an upper limit value of a transmission current and a margin value.

In FIG. 12, the circuit device 10 is provided with a register 70, an interface circuit 72, and a storage section 74. Further, the register 70 stores the upper limit value and the margin value described above. The register 70 can be realized by, for example, flip-flop circuits or a RAM. As the interface circuit 72, there can be used a serial interface circuit compliant with, for example, SPI (Serial Peripheral Interface) or I²C (Inter-Integrated Circuit). The storage section 74 can be realized by a semiconductor memory such as a nonvolatile memory. Further, the upper limit value and the margin value are written to the register 70 from an external device via the interface circuit 72. Alternatively, the upper limit value and the margin value are loaded from the storage section 74 realized by the nonvolatile memory or the like, and are then written to the register 70. Then, the amplitude setting circuit 50 retrieves the upper limit value from the register 70, and then varies the amplitude setting value until the amplitude setting value reaches the upper limit value thus retrieved in the detection period. Alternatively, the judgment circuit 60 retrieves the margin value from the register 70, and determines the amplitude setting value to be used when performing the HS communication based on the detection result by the amplitude detection circuit 40 and the margin value thus retrieved.

Further, a variety of methods can be adopted as a method of increasing the setting level of the transmission current in the HS mode when performing the host chirp. For example, as described above, it is possible to monotonically increase the setting level from the minimum level to the maximum level, but it is also possible to monotonically decrease the setting level. Alternatively, it is possible to adopt a binary search method to reduce the number of steps necessary to determine the level. Such a binary search method is effective in particular when the number of levels of the transmission current in the HS mode is large. Further, the switching timing of the levels is not required to be every reciprocal action of the host chirp K/J, but it is possible to switch the level in the middle of the output of the chirp K/J. For example, it is possible to change the setting level from the level 0 to the level 1, from the level 1 to the level 0, and from the level 0 to the level 1 in the middle of one reciprocal action of the host chirp K/J. Alternatively, as long as the setting level can be determined in the period before the host chirp K/J is terminated, it is possible to switch the levels out of sync with the switching timing of the host chirp K/J. It should be noted that when switching the levels while transmitting the host chirp K or the host chirp J, it take finite length of time until the current value is stabilized, and therefore, it is conceivable that the disconnection detection result becomes unstable. Therefore, the method of switching the levels every reciprocal action of the host chirp K/J has an advantage. Further, it is possible to arrange that the host chirp K/J continues to be output at the optimum level after the optimum setting level of the transmission current in the HS mode has been determined.

Further, it is possible to arrange that the timing at which the judgment circuit 60 or the like receives the detection result from the amplitude detection circuit 40 avoids the timing for switching between the host chirp K and the host chirp J, or the setting levels of the transmission current in the HS mode. It is also possible to arrange that the detection result is received at a little interval from the switching between the setting levels in order to obtain the stable detection result.

As described above, according to the present embodiment, it is possible to determine the amplitude setting value such as the transmission current value in the HS mode the best suited to that system after the device of the USB to actually become the communication counterpart is connected with the cable to actually be used, and the bus is connected in completely the same state as when performing the communication. In other words, it becomes possible to maximize the opening of the eye pattern while increasing the signal amplitude to the highest level within the range in which the false detection of the disconnection does not occur. Further, on this occasion, since no vender-unique request is required, it becomes possible to cover all of the devices of the USB.

3. Various Application Examples

Then, a variety of application examples of the present embodiment will be described. For example, the method of the present embodiment can be realized in the downstream port of the hub. In other words, the method of the present embodiment can be applied also to the downstream port of the hub coupled under the host. For example, when the downstream port of the hub is enabled by the host, the hub awaits the device connection to the downstream port. When the device is coupled, the host detects the connection of the device, and then the HS detection handshake is started between the downstream port and the device. Then, in the case of the first method of the present embodiment, in the period of the HS detection handshake, the amplitude setting circuit 50 varies the signal amplitude, and the judgment circuit 60 determines the amplitude setting value to be used in the HS communication based on the detection result by the amplitude detection circuit 40. Further, in the case of the second method of the present embodiment, in the transmission period of the SOF packet following the HS detection handshake, the amplitude setting circuit 50 varies the signal amplitude, and the judgment circuit 60 determines the amplitude setting value to be used in the HS communication based on the detection result by the amplitude detection circuit 40. It should be noted that when applying the second method of the present embodiment to the hub, the method becomes a little bit complicated. In the case of the hub, the SOF packet just receives what is transmitted by the host with an upstream port, and then repeats it to all of the downstream ports, but the hub itself does not generate the SOF packet. Therefore, cooperation with the host becomes necessary. For example, after the setting level of the transmission current in the HS mode of the downstream port is determined, the hub notifies the host of the fact that the device of the USB is virtually disconnected from the downstream port. Such a mechanism of the disconnection notification is stipulated in the USB specification. Then, the host instructs the hub to reset the downstream port, and therefore, it is sufficient for the downstream port to start the bus reset once again, and then start the HS communication at the setting level of the transmission current in the HS mode thus determined.

Figure 13:
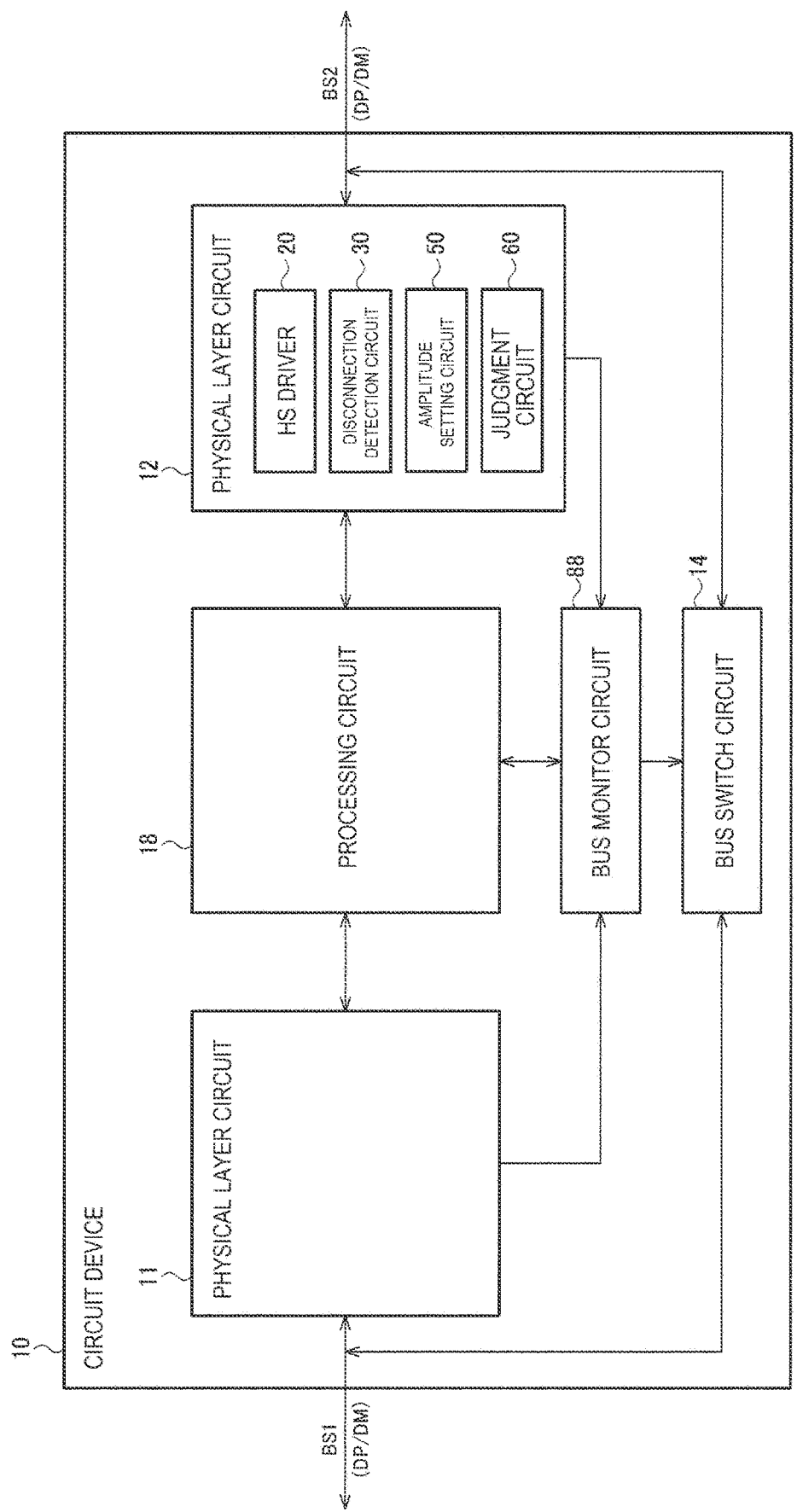
FIG. 13 is a diagram showing another specific configuration example of a circuit device according to the embodiment.

FIG. 13 shows another configuration example of the circuit device 10 to which the method of the present embodiment can be applied. The circuit device 10 shown in FIG. 13 includes physical layer circuits 11, 12 and a bus switch circuit 14. Further, it is possible for the circuit device 10 to include a processing circuit 18 and a bus monitor circuit 88. The physical layer circuit 11 is, for example, a first physical layer circuit, and the physical layer circuit 12 is, for example, a second physical layer circuit.

To the physical layer circuit 11, there is coupled a bus BS1 compliant with the USB specification. To the physical layer circuit 12, there is coupled a bus BS2 compliant with the USB specification. The bus BS1 is, for example, a first bus, and the bus BS2 is, for example, a second bus. Each of the physical layer circuits 11, 12 is formed of an analog circuit in the physical layer. The analog circuit in the physical layer is, for example, the HS driver or the FS driver as a transmission circuit, the HS receiver or the FS receiver as a reception circuit, a variety of detection circuits, or the pull-up resistor circuit. It should be noted that a circuit corresponding to a link layer such as a serial/parallel conversion circuit of converting serial data received via the USB into parallel data, a parallel/serial conversion circuit of converting parallel data into serial data, an elastic buffer, or an NRZI circuit is included in the processing circuit 18. For example, a circuit corresponding to the link layer or the like out of a transceiver macrocell of the USB is included in the processing circuit 18, and the analog circuit such as the driver in the HS mode or the FS mode, the receiver, or the detection circuit is included in the physical layer circuits 11, 12.

The bus BS1 is, for example, a bus to which the host is coupled, and the bus BS2 is, for example, a bus to which the device is coupled. It should be noted that the present embodiment is not limited to such a connection configuration, and can deal with a connection configuration in which the device is connection to the bus BS1, and the host is coupled to the bus BS2. The buses BS1, BS2 are each a bus compliant with the USB specification including the signal lines of the DP, DM signals as first, second signals constituting the differential signal. It is possible for the buses BS1, BS2 to include signal lines of the power supply VBUS, GND. The USB specification is a specification of given data transfer in a broad sense.

One end of the bus switch circuit 14 is coupled to the bus BS1, and the other end thereof is coupled to the bus BS2. Further, the bus switch circuit 14 sets the connection between the bus BS1 and the bus BS2 ON or OFF. Specifically, the bus switch circuit 14 electrically couples the bus BS1 and the bus BS2 to each other, and electrically discouples them from each other. Setting the connection between the bus BS1 and the bus BS2 ON or OFF means turning ON or OFF switch elements or the like disposed between, for example, the signal lines of the DP, DM signals in the bus BS1 and the signal lines of the DP, DM signals in the bus BS2. Further, the connection between the circuits and the connection between the bus or the signal line and the circuit in the present embodiment are each electrical connection. The electrical connection means connection capable of transmitting an electrical signal, and is connection with which transmission of information by the electrical signal becomes achievable. The electrical connection can also be connection via, for example, a signal line or an active element.

Specifically, the bus switch circuit 14 sets the connection between the bus BS1 and the bus BS2 ON in the first period. Specifically, the bus switch circuit 14 has switch elements disposed between the bus BS1 and the bus BS2, and the switch elements turn ON in the first period. Thus, it becomes possible for the host coupled to the bus BS1 and the device coupled to the bus BS2 to perform the signal transfer of the USB directly with the bus of the USB. It should be noted that as the switch elements, there are disposed, for example, the first switch element for the DP signal and the second switch element for the DM signal. Further, the host is, for example, a main controller, and the device is, for example, a peripheral device. Further, the bus switch circuit 14 sets the connection between the bus BS1 and the bus BS2 OFF in the second period. Specifically, in the second period, the switch elements disposed between the bus BS1 and the bus BS2 turn OFF. The processing circuit 18 is made to perform a transfer process described below in the second period.

The bus monitor circuit 88 performs a monitoring operation of the bus BS1 and the bus BS2. Specifically, the bus monitor circuit 88 performs the monitoring operation of the bus BS1 and the bus BS2 using the physical layer circuits 11, 12. Specifically, the bus monitor circuit 88 performs the monitoring operation of monitoring the states of the bus BS1 and the bus BS2 based on signals from the physical layer circuit 11 and signals from the physical layer circuit 12. Further, the bus switch circuit 14 sets the connection between the buses BS1, BS2 ON or OFF based on the monitor result in the bus monitor circuit 88. For example, the bus switch circuit 14 sets the connection between the buses BS1, BS2 ON in the first period and sets the connection between the buses BS1, BS2 OFF in the second period based on the monitor result in the bus monitor circuit 88.

The processing circuit 18 is a circuit for performing the transfer process and a variety of types of control process, and can realized by a logic circuit or the like with automatic arrangement wiring such as a gate array. It should be noted that it is possible to realize the processing circuit 18 by a processor such as a CPU or an MPU.

Further, the processing circuit 18 performs a resynchronization process. Specifically, when the bus switch circuit 14 is in an OFF state, the processing circuit 18 performs the transfer process of transmitting a packet which has been received from the bus BS1 via the physical layer circuit 11 to the bus BS2 via the physical layer circuit 12, and transmitting a packet which has been received from the bus BS2 via the physical layer circuit 12 to the bus BS1 via the physical layer circuit 11. In other words, the transfer process is performed in the second period. For example, the transfer process is performed in at least a part of the second period. The packet is transferred, for example, from the bus BS1 side to the bus BS2 side, or from the bus BS2 side to the bus BS1 side without changing the packet format. On this occasion, the processing circuit 18 performs predetermined signal processing in the transfer process. The predetermined signal processing is signal processing for the packet transfer, and is signal processing for transferring a repeat packet of the packet received. For example, the processing circuit 18 performs the resynchronization process of bits of a predetermined packet as the predetermined signal processing. For example, when receiving the packet, each of the bits of the packet is sampled based on a clock signal generated in the circuit device 10. When transmitting the packet, each of the bits of the packet is transmitted in sync with the clock signal generated in the circuit device 10. When performing the packet transfer on the transfer path via the processing circuit 18, by the processing circuit 18 performing the resynchronization process as the predetermined signal processing, it becomes possible to realize the signal transfer high in quality improving the deterioration of the signal characteristics of the transmission signal of the USB.

It should be noted that in FIG. 13, there is disposed the processing circuit 18 for performing such a resynchronization process, but there can be adopted a modified implementation in which the resynchronization process is not performed. In this case, it is sufficient for the processing circuit 18 for performing at least the control process of the handshake for the HS detection as described later to be disposed between the physical layer circuit 11 and the physical layer circuit 12.

Figure 14:
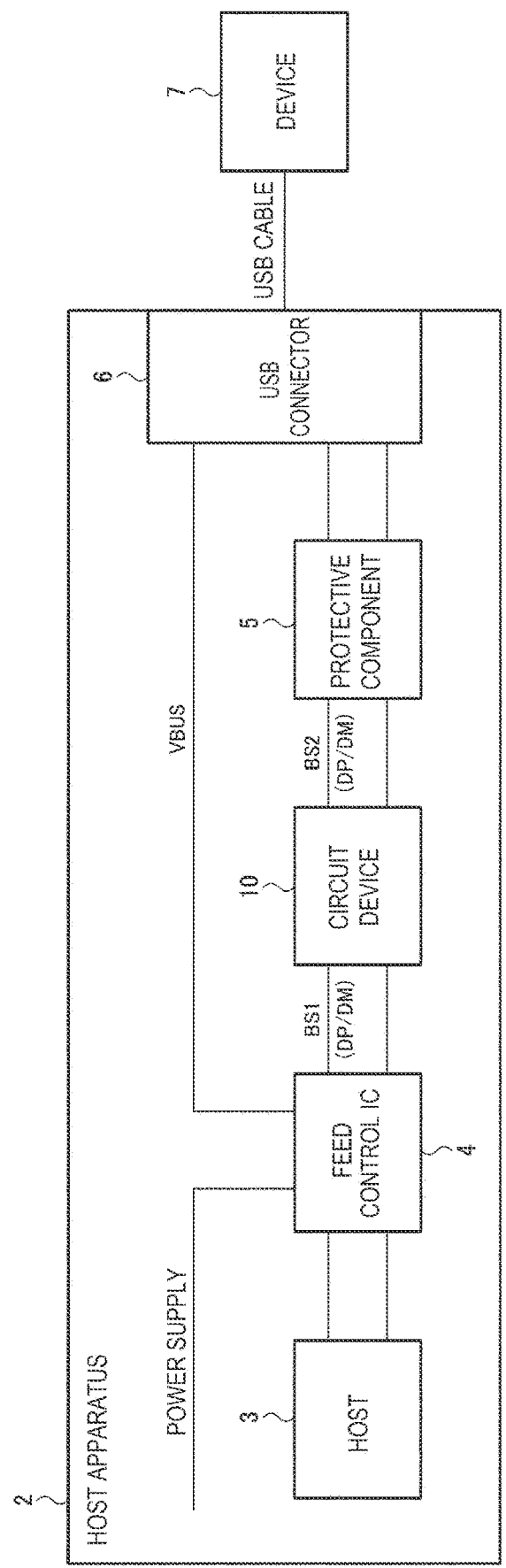
FIG. 14 is a diagram showing a configuration example of a host apparatus including the circuit device.

FIG. 14 shows a configuration example of the host apparatus 2 including the circuit device 10 according to the present embodiment. The host apparatus 2 includes, for example, the host 3, a feed control IC 4, the circuit device 10, a protective component 5, and a USB connector 6. The host 3 is, for example, the main controller, and is realized by an SOC (System On-a-Chip) or the like. The feed control IC 4 is supplied with the power, and performs feed control compliant with the BC protocol or the like. Thus, it becomes possible to supply the power capable of supplying a high current to the device 7 as VBUS. The protective component 5 is, for example, an electrostatic protective element. The USB connector 6 is, for example, a receptacle of the USB, and one end of the USB cable is connected to the USB connector 6. The device 7 to be coupled to the other end of the USB cable is a peripheral device such as a smartphone.

As shown in FIG. 14, the bus BS1 of the circuit device 10 is coupled to the host 3 via the feed control IC 4, and the bus BS2 is coupled to the device 7 via the protective component 5, the USB connector 6, and the USB cable. As described above, the buses BS1, BS2 are not required to directly be coupled to the host 3 and the device 7, respectively, and can be coupled via a circuit element, a cable, or the like. Further, in FIG. 14, the host 3 is coupled to the bus BS1, and the device 7 is coupled to the bus BS2, but the circuit device 10 according to the present embodiment is capable of dealing with a connection configuration in which the device 7 is coupled to the bus BS1, and the host 3 is coupled to the bus BS2.

Further, in FIG. 13, the HS driver 20, the disconnection detection circuit 30, the amplitude setting circuit 50, and the judgment circuit 60 are provided to the physical layer circuit 12. It should be noted that it is possible to provide some of these circuits to the processing circuit 18. Further, it is possible to provide the physical layer circuit 11 with the disconnection detection circuit, the amplitude setting circuit, and the judgment circuit in addition to the HS driver. The disconnection detection circuit 30 corresponds to the amplitude detection circuit 40 in FIG. 1 and FIG. 2. Further, the amplitude setting circuit 50 varies the signal amplitude with the amplitude setting value in the detection period, and the judgment circuit 60 determines the amplitude setting value to be used by the amplitude setting circuit 50 when performing the HS communication based on the detection result by the disconnection detection circuit 30 during the detection period.

Specifically, when the device of the USB is coupled to the circuit device 10 for performing the resynchronization process shown in FIG. 13 via, for example, the bus BS2, the HS detection handshake is performed between the circuit device 10 and the device as a first step. Here, the optimum setting level of the transmission current in the HS mode is determined using the host chirp using substantially the same method as the first method shown in FIG. 8 and FIG. 9.

Subsequently, the HS connection is stopped. It should be noted that when the circuit device 10 transmits the SOF packet toward the device after the HS detection handshake, it is possible to realize the method of using the SOF packet similarly to the second method shown in FIG. 10 and FIG. 11. In this case, the HS connection is stopped after transmitting the necessary number of SOF packets to determine the setting level of the transmission current in the HS mode.

Then, as a second step, the bus switch circuit 14 of the circuit device 10 is switched ON to make the interaction between the host coupled to the bus BS1 and the device coupled to the bus BS2 possible. Thus, the HS detection handshake is performed between the host and the device, and thus, the HS connection between the host and the device is established. After the HS connection is established, the bus switch circuit turns OFF, and the HS communication due to the resynchronization process on the transfer path via the physical layer circuit 11, the processing circuit 18, and the physical layer circuit 12 is performed. The setting level of the transmission current in the HS mode on this occasion is set to the level determined in the first step described above.

In the case of the first method using the host chirp, as shown in FIG. 8 and FIG. 9, the setting level of the transmission current in the HS mode is gradually increased to thereby gradually increase the amplitude of the portion of the host chirp K/J (HS), and thus, the setting level of the transmission current in the HS mode is determined based on the detection result of the signal amplitude and the threshold value of the amplitude. In the second step, the setting level of the transmission current in the HS mode determined in the first step is set from the beginning to start the HS communication. In the case of the second method using the SOF packet, the necessary number of SOF packets are transmitted subsequently to the host chirp as shown in FIG. 10. Then, the amplitude of the SOF packet is gradually increased by gradually increasing the setting level of the transmission current in the HS mode, and then, the setting level of the transmission current in the HS mode is determined based on the detection result of the signal amplitude and the threshold value of the amplitude. In the second step, the setting level of the transmission current in the HS mode determined in the first step is set from the beginning to start the HS communication.

It should be noted that in any of the configurations shown in FIG. 3 and FIG. 13 and the configuration of the hub, when performing the role switch in which the host and the device swap the roles thereof, it is possible to perform the communication at the same setting level of the transmission current in the HS mode even after the ports on which the role switch is performed turn to the upstream ports. This is because the same apparatuses are kept coupled with the same transmission path, and the state of the bus does not change between before and after the role switch, and therefore, the optimum setting level of the transmission current in the HS mode does not change.

Further, in the circuit device 10 having a plurality of ports such as a hub, it is also possible to apply the setting level of the transmission current in the HS mode in one port to another port. Since another port is different in connection counterpart and the state of the transmission path, the setting level applied in such a manner is not necessarily the optimum setting level. However, since the upstream port does not transmit the SOF packet, the false detection of the disconnection does not occur whatever level is set as the setting level of the transmission current in the HS mode. Since the increase in the amplitude value is simply intended to improve the communication performance, there is no other reason than the reason that it is possible to use the same setting as an example of increasing the transmission current value.

4. Electronic Apparatus, Vehicle

Figure 15:
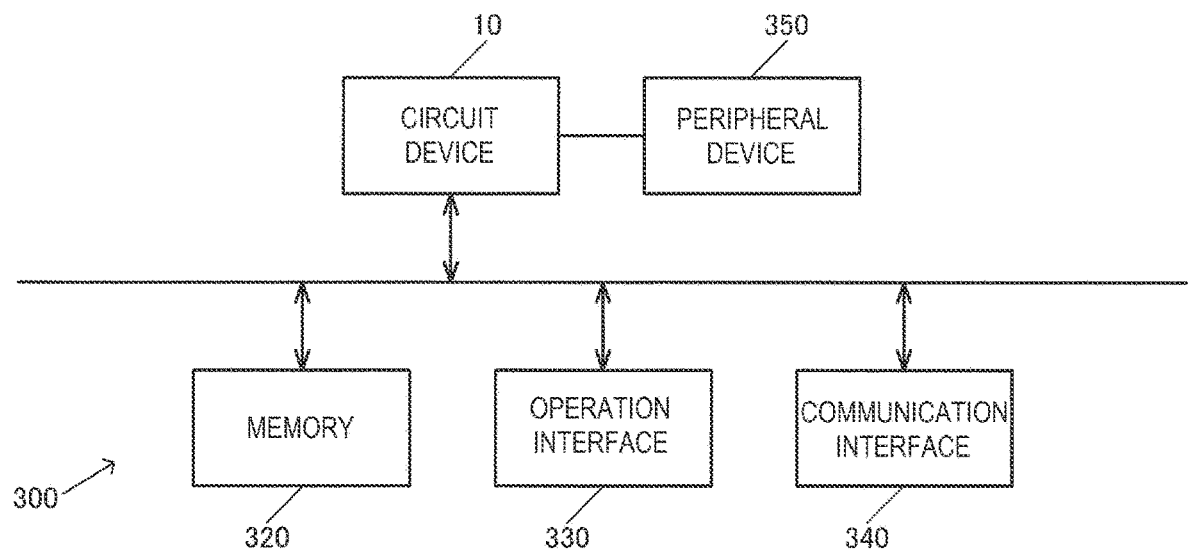
FIG. 15 is a diagram showing a configuration example of an electronic apparatus.

FIG. 15 shows a configuration example of the electronic apparatus 300 including the circuit device 10 according to the present embodiment. The electronic apparatus 300 includes the circuit device 10 according to the present embodiment. In the case of the configurations described with reference to FIG. 1 and FIG. 2, the circuit device 10 acts as a host controller or a main controller, and in the case of the configuration described with reference to FIG. 13, the host controller or the main controller to be coupled to the circuit device 10 is further provided. The circuit device 10 is coupled to a peripheral device 350 such as a portable terminal device. The circuit device 10 performs control processing of the electronic apparatus 300, a variety of types of signal processing, and so on. As the peripheral device 350, there can be assumed, for example, the portable terminal device, but this is not a limitation. The peripheral device 350 can be a wearable apparatus or the like.

The electronic apparatus 300 can further include a memory 320, an operation interface 330, and a communication interface 340. The memory 320 stores data from, for example, the operation interface 330 or the communication interface 340, or functions as a work memory of the circuit device 10. The memory 320 can be realized by a semiconductor memory such as a RAM (Random Access Memory) or a ROM (Read Only Memory), or a magnetic storage device such as a hard disk drive. The operation interface 330 is a user interface for receiving a variety of operations from the user. For example, the operation interface 330 can be realized by a variety of buttons, a touch panel, or the like. The communication interface 340 is an interface for performing communication of a variety of types of data such as control data or image data. A communication process of the communication interface 340 can be wired communication process, or can also be wireless communication process.

As a specific example of the electronic apparatus 300, there can be cited a variety of types of electronic apparatus such as an in-car apparatus such as a car navigation apparatus, an in-car audio apparatus, or a meter panel, a projector, head-mounted display, a printer, a personal digital assistance, a portable gaming terminal, a robot, or an information processing device. Alternatively, the electronic apparatus 300 can be a biological information measurement apparatus, a measurement apparatus for measuring a physical quantity such as a distance, time, a flow speed, or a flow rate, a network gear such as a base station or a router, a content providing apparatus for delivering a content, or a video apparatus such as a digital camera or a video camera.

Figure 16:
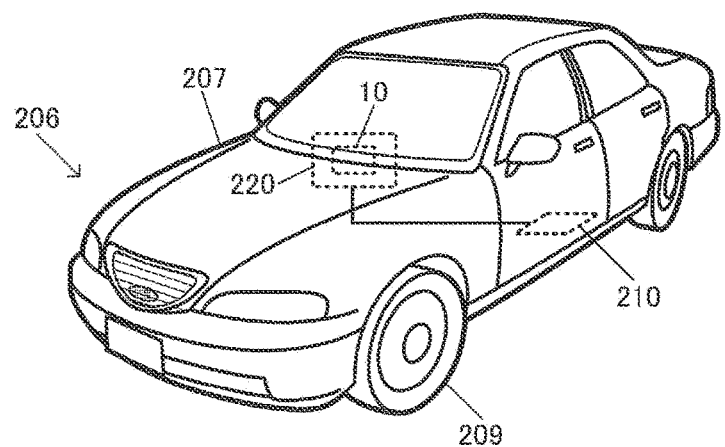
FIG. 16 is a diagram showing a configuration example of a vehicle.

FIG. 16 shows a configuration example of a vehicle including the circuit device 10 according to the present embodiment. The vehicle is equipment or an apparatus which is equipped with a drive mechanism such as an engine or an electric motor, a steering mechanism such as a steering wheel or a helm, and a variety of types of electronic apparatus, and moves on the ground, in the air, or on the sea. As the vehicle according to the present embodiment, there can be assumed, for example, a car, an airplane, a motorbike, a ship, a boat, or a robot. FIG. 16 schematically shows a car 206 as a specific example of the vehicle. The car 206 has a car body 207 and wheels 209. The car 206 incorporates an in-car apparatus 220 having the circuit device 10, and a control device 210 for controlling each section of the car 206. The control device 210 can include, for example, an ECU (Electronic Control Unit). The circuit device 10 according to the present embodiment can be a circuit device to be provided to the control device 210. The in-car apparatus 220 is, for example, a car navigation apparatus, an in-car audio apparatus, or a panel apparatus such as a meter panel.

As described hereinabove, the circuit device according to the present embodiment includes an HS driver as a transmission circuit in an HS mode of USB, an amplitude detection circuit configured to detect a signal amplitude of a USB signal, an amplitude setting circuit configured to set an amplitude setting value of the signal amplitude of the USB signal, and a judgment circuit. Further, the amplitude setting circuit varies the signal amplitude with the amplitude setting value in a detection period, and the judgment circuit determines the amplitude setting value to be used by the amplitude setting circuit when performing HS communication based on a detection result by the amplitude detection circuit in the detection period.

According to the present embodiment, the amplitude setting circuit varies the signal amplitude of the USB signal, and the amplitude detection circuit detects the signal amplitude of the USB signal. Then, the judgment circuit determines the amplitude setting value to be used by the amplitude setting circuit when performing the HS communication based on the detection result by the amplitude detection circuit in the detection period. When adopting this configuration, it is possible to determine the amplitude setting value to be used when performing the HS communication based on the detection result in the amplitude detection circuit when varying the signal amplitude of the USB signal during the detection period. Further, by setting the signal amplitude of the USB signal using the amplitude setting value thus determined to perform the HS communication, it becomes possible to realize the HS communication with an appropriate signal amplitude. Therefore, it becomes possible to realize both of the prevention of the occurrence of the problem caused by the increase in the signal amplitude, and the HS communication with a larger signal amplitude.

Further, in the present embodiment, the HS driver may include a current source configured to output a variable transmission current, and the amplitude setting circuit may set a value of the transmission current as the amplitude setting value to thereby set the signal amplitude.

When adopting this configuration, by controlling the transmission current value of the current source provided to the HS driver, it becomes possible to vary the signal amplitude of the USB signal.

Further, in the present embodiment, the amplitude setting circuit may set a value of a termination resistor of the USB as the amplitude setting value to thereby set the signal amplitude.

When adopting this configuration, by controlling the value of the termination resistor of the USB, it becomes possible to vary the signal amplitude of the USB.

Further, in the present embodiment, the amplitude detection circuit may be a disconnection detection circuit configured to detect device disconnection of the USB.

When adopting this configuration, it becomes possible to detect the signal amplitude of the USB signal making efficient use of the disconnection detection circuit provided for detecting the device disconnection of the USB, and thus, it becomes possible to realize reduction in scale and so on of a circuit.

Further, in the present embodiment, the amplitude setting circuit may vary the signal amplitude taking a period in which the HS driver transmits a host chirp with HS termination set in an ON state as the detection period.

When adopting this configuration, it becomes possible to determine the amplitude setting value using the host chirp, and thus, it becomes possible to prevent, for example, the start of the actual HS communication from being delayed.

Further, in the present embodiment, the amplitude setting circuit may vary the signal amplitude taking a period in which the HS driver transmits an SOF packet as the detection period.

When adopting this configuration, it becomes possible to determine the amplitude setting value using the SOF packet actually used for detecting that the HS communication is in progress.

Further, in the present embodiment, the HS driver may start bus reset by transmitting SE0 after the judgment circuit determines the amplitude setting value to be used for the HS communication.

When adopting this configuration, it becomes possible to perform the HS detection handshake once again to perform the HS communication by performing the bus reset once again after determining the amplitude setting value.

Further, in the present embodiment, an upper limit value may be set in the amplitude setting value, and the amplitude setting circuit may vary the amplitude setting value in the detection period until the upper limit value is reached.

When adopting this configuration, it is possible to prevent a circumstance in which the amplitude setting value which is set based on the detection result of the signal amplitude becomes unnecessarily large to fail to set an appropriate signal amplitude corresponding to the use environment.

Further, in the present embodiment, the judgment circuit may determine the amplitude setting value to be used by the amplitude setting circuit when performing the HS communication based on the detection result by the amplitude detection circuit and a margin value.

When adopting this configuration, it becomes possible to determine the appropriate amplitude value which deals with a use situation, an environmental fluctuation, and so on.

Further, in the present embodiment, there may further be included a first physical layer circuit to which a first bus in a USB specification is coupled, a second physical layer circuit which has the HS driver and the amplitude detection circuit, and to which a second bus in the USB specification is coupled, and a bus switch circuit one end of which is coupled to the first bus, another end of which is coupled to the second bus, and which sets a connection between the first bus and the second bus one of ON and OFF.

When adopting this configuration, it becomes possible to set the signal amplitude of the USB signal in the second bus to an appropriate amplitude in a circuit device having a configuration having the first physical layer circuit, the second physical layer circuit, and the bus switch circuit.

Further, in the present embodiment, there may further be included a downstream port circuit having the HS driver and the amplitude detection circuit, and a control circuit configured to control the downstream port circuit.

When adopting this configuration, it becomes possible to realize a circuit device of the host controller or the hub of the USB.

Further, the present embodiment relates to an electronic apparatus including any one of the circuit devices described above.

Further, the present embodiment relates to a vehicle including any one of the circuit devices described above.

It should be noted that although the present embodiment is hereinabove described in detail, it should easily be understood by those skilled in the art that it is possible to make a variety of modifications not substantially departing from the novel matters and the advantages of the present disclosure. Therefore, all of such modified examples should be included in the scope of the present disclosure. For example, a term described at least once with a different term having a broader sense or the same meaning in the specification or the accompanying drawings can be replaced with that different term in any part of the specification or the accompanying drawings. Further, all of the combinations of the present embodiment and the modified examples are also included in the scope of the present disclosure. Further, the configurations and the operations of the circuit device, the electronic apparatus, and the vehicle are not limited to those described in the present embodiment, but can be implemented with a variety of modifications.

What is claimed is:

1. A circuit device comprising:
   an HS (High Speed) driver as a transmission circuit in an HS mode of USB (Universal Serial Bus);
   an amplitude detection circuit configured to detect a signal amplitude of a USB signal;
   an amplitude setting circuit configured to set an amplitude setting value of the signal amplitude of the USB signal; and
   a judgment circuit, wherein the amplitude setting circuit varies the signal amplitude with the amplitude setting value in a detection period, and the judgment circuit determines the amplitude setting value to be used by the amplitude setting circuit when performing HS communication based on a detection result by the amplitude detection circuit in the detection period,
   wherein the amplitude detection circuit is directly electrically connected to the HS driver to measure the detection result,
   the HS driver includes a current source configured to output a variable transmission current, and the amplitude setting circuit sets a value of the transmission current as the amplitude setting value to thereby set the signal amplitude by outputting an instruction signal for setting the value of the transmission current to the current source and the current source increases the value of the transmission current, and
   wherein the judgment circuit varies the signal amplitude after a termination resistor is set ON.

2. The circuit device according to claim 1, wherein the amplitude setting circuit sets a value of a termination resistor of the USB as the amplitude setting value to thereby set the signal amplitude.

3. The circuit device according to claim 1, wherein the amplitude detection circuit is a disconnection detection circuit configured to detect device disconnection of the USB.

4. The circuit device according to claim 1, wherein the amplitude setting circuit varies the signal amplitude taking a period in which the HS driver transmits a host chirp with HS termination set in an ON state as the detection period.

5. The circuit device according to claim 1, wherein the amplitude setting circuit varies the signal amplitude taking a period in which the HS driver transmits an SOF (Start of Frame) packet as the detection period.

6. The circuit device according to claim 1, wherein the HS driver starts bus reset by transmitting SE0 (Single-Ended Zero) after the judgment circuit determines the amplitude setting value to be used for the HS communication.

7. The circuit device according to claim 1, wherein an upper limit value is set in the amplitude setting value, and the amplitude setting circuit varies the amplitude setting value in the detection period until the upper limit value is reached.

8. The circuit device according to claim 1, wherein the judgment circuit determines the amplitude setting value to be used by the amplitude setting circuit when performing the HS communication based on the detection result by the amplitude detection circuit and a margin value.

9. The circuit device according to claim 1, further comprising:
   a first physical layer circuit to which a first bus in a USB specification is coupled;
   a second physical layer circuit which has the HS driver and the amplitude detection circuit, and to which a second bus in the USB specification is coupled; and
   a bus switch circuit one end of which is coupled to the first bus, another end of which is coupled to the second bus, and which sets a connection between the first bus and the second bus one of ON and OFF.

10. The circuit device according to claim 1, further comprising:
    a downstream port circuit having the HS driver and the amplitude detection circuit; and
    a control circuit configured to control the downstream port circuit.

11. An electronic apparatus comprising:
    the circuit device according to claim 1.

12. A vehicle comprising:
    the circuit device according to claim 1.

* * * * *